United States Patent [19]
McGrath et al.

[11] Patent Number: 5,345,409
[45] Date of Patent: Sep. 6, 1994

[54] PROGRAMMABLE DIGITAL SIGNAL PROCESSOR SYSTEM FOR PROCESSING ELECTRICAL POWER SIGNALS

[75] Inventors: Donald T. McGrath, Scotia; Joseph E. Krisciunas, Clifton Park, both of N.Y.; Steven L. Garverick, University Heights, Ohio; Philippe Jacob, New York, N.Y.

[73] Assignee: General Electric Company, Schenectady, N.Y.

[21] Appl. No.: 36,743

[22] Filed: Mar. 25, 1993

[51] Int. Cl.$^5$ .................... G06F 7/00; G01R 19/00
[52] U.S. Cl. .................................. 364/736; 364/483
[58] Field of Search .................. 364/736, 724.10, 481, 364/483, 726; 341/77, 110

[56] References Cited

U.S. PATENT DOCUMENTS

| 4,547,726 | 10/1985 | Premerlani . | |
|---|---|---|---|
| 4,715,000 | 12/1987 | Premerlani | 364/484 |
| 4,723,216 | 2/1988 | Premerlani | 364/484 |
| 4,896,156 | 1/1990 | Garverick | 341/143 |
| 4,951,052 | 8/1990 | Jacob et al. | 341/122 |
| 5,126,961 | 6/1992 | Garverick | 364/724.1 |
| 5,134,578 | 7/1992 | Garverick et al. | 364/752 |
| 5,181,033 | 1/1993 | Yassa et al. | 341/143 |

OTHER PUBLICATIONS

"A Use of Limit Cycle Oscillations to Obtain Robust Analog-to-Digital Converters," James C. Candy, IEEE Transactions on Communications, vol. COM-22, No. 3, pp. 298-305, Mar., 1974.
"A Programmable Mixed Signal ASIC for power Management," D. McGrath, P. Jacob, H. Sailer, IEEE 1992 Custom Integrated Circuits Conference, pp. 19.4.1-19.4.3.
"Using Triangularly Weighted Interpolation to Get 13-Bit PCM from a Sigma-Delta Modulator," James C. Candy, Y. C. Ching, D. S. Alexander, IEEE Transactions on Communications, pp. 1268-1275, Nov., 1976.
"A Programmable Mixed-Signal ASIC for Power Metering," S. L. Garverick, D. T. McGrath, R. D. Baertsch, K. Fujino, 1991 IEEE International Solid State Circuits Conference, Digest of Technical Papers, pp. 36-37.
"A Programmable Mixed-Signal ASIC for power Metering," S. L. Garverick, K. Fujino, D. T. McGrath, R. D. Baertsch, IEEE Journal of Solid-State Circuits, vol. 26, No. 12, pp. 2008-2016, Dec. 1991.

Primary Examiner—Long T. Nguyen
Attorney, Agent, or Firm—Enrique J. Mora; Marvin Snyder

[57] ABSTRACT

A system for processing digital electrical power signals derived from at least one externally supplied, substantially continuous, substantially alternating, electrical signal having a primary or fundamental frequency, comprises: a multiply-accumulate arithmetic processor having three input ports with at least one input port for receiving the digital electrical power signals, an output port and a processor control port; a first memory unit for storing a plurality of processor control signals; a second and third memory unit each for storing a separate plurality of processor input signals; and a memory control unit having the capability to respectively couple the first memory unit to the processor control port, and the first processor input port to one of the second and third memory units for each cycle of the primary frequency so that newly received digital electrical power signals may be continually processed by the processor for a predetermined number of cycles.

27 Claims, 12 Drawing Sheets 5,345,409

PROGRAMMABLE DIGITAL SIGNAL PROCESSOR SYSTEM FOR PROCESSING ELECTRICAL POWER SIGNALS

RELATED APPLICATION

This application is related to patent application Ser. No. 08/025,456 (RD-22,053), entitled "Programmable Decimation Filter," by Krisciunas et al., filed Mar. 25, 1993, patent application Ser. No. 08/036,742 (RD-21,788), entitled "Memory Storage Verification Device for use in an Integrated Circuit for Performing Power Signal Measurements," by McGrath et al., filed Mar. 25, 1993, patent application Ser. No. 07/728,408 (RD-21,093), entitled "Measuring Electrical Parameters of Power Line Operation, Using a Digital Computer," by Garverick et al., filed Jul. 11, 1992, patent application Ser. No. 07/653,935 (RD-20,882), entitled "Data Acquisition Systems with Programmable Bit-Serial Digital Signal Processors," by Garverick et al., filed Feb. 11, 1991, and patent application Ser. No. 07/726,443 (RD-21,444), continuation-in-part of U.S. Pat. No. 5,126,961, (RD-21,091), entitled "Plural-Channel Decimation Filter, as for Sigma-Delta Analog-to-Digital Converters," issued Jun. 30, 1992, all assigned in whole or in part to the assignee of the present invention and herein incorporated by reference.

FIELD OF THE INVENTION

This invention relates to power measurement, metering, and management, and, more particularly, to a programmable digital signal processor system adapted for use in power measurement, metering, and management systems.

BACKGROUND OF THE INVENTION

Several conflicting objectives are present in the field of high performance data acquisition for electrical power measurement, metering, and management. The first objective is high data resolution. The availability of high resolution analog-to-digital conversion methods, such as with sigma-delta modulators, combined with the power of state-of-the-art digital signal processors provides the capability to achieve significant levels of accuracy. Thus, complex signal processing may be performed on precise data using a conventional architecture, such as an architecture comprising one analog-to-digital converter and one processor per channel. However, a second objective is increasing signal processing bandwidth. An inherent tension exists between these objectives in that increasing bandwidth typically occurs at the expense of data resolution. One way to overcome this problem is to modify the bandwidth to suit the particular application or use. Likewise, analog-to-digital conversion has technological limitations associated with the difficulty of producing cost-effective, low noise, precise analog circuitry. Yet, a third objective is smaller integrated or electronic circuitry that also requires less power to operate. Thus, while a converter and a processor per channel may achieve such resolution or bandwidth requirements, the size and power for such a system may render it impractical or infeasible for most applications, particularly power measurement, metering, and management. Time multiplexing a single converter offers one possible approach, however, this further reduces bandwidth and increases the complexity of the analog circuitry necessary for implementation.

For a digital signal processing system to be attractive for use in power measurement, metering and management, several other features are desirable. The system should have the capability to perform digital signal processing at or near the site of data acquisition in order to reduce the amount of data to be transmitted via communication channels or to be "off-loaded" to other processors. Furthermore, it should be capable of real time or adaptive feedback control in order to permit its use at remote locations for extended periods of time. It should also have the flexibility to execute different complex processor operations, including multiplication, addition, frequency spectrum analysis, counting, threshold detection, integration and differentiation. A need thus exists for a device for use in processing signals that provides electrical power measurements, termed electrical power signals, in which the device has the capability for high performance data acquisition while also having: the capability to perform digital signal processing, the capability to realize a variety of different bandwidths, the flexibility to be reconfigured, and the capability to perform real time or adaptive feedback control.

SUMMARY OF THE INVENTION

One object of the invention is to provide a device or system for processing electrical power signals having the capability to be reconfigured to perform a variety of digital signal processing and frequency spectrum analysis tasks.

Another object of the invention is to provide a device or system for processing electrical power signals having the capability for adaptive feedback control of the digital signal processing performed in response to the electrical power signal measurements obtained.

Yet another object of the invention is to provide a device or system for processing electrical power signals having the capability, during the execution of the digital signal processing, to trade-off the desired bandwidth of the electrical power signals against the desired resolution of the data.

Briefly, in accordance with one embodiment of the invention, a device or system for processing digital electrical power signals derived from at least one externally derived, substantially continuous, substantially alternating, electrical signal substantially having a primary or fundamental frequency, comprises: a multiply-accumulate arithmetic processor having three input ports, at least one input port for receiving the digital electrical power signals, an output port and a processor control port; a first memory unit for storing a plurality of processor control signals; a second and third memory unit each for storing a separate plurality of processor input signals, respectively; and a memory control unit having the capability to respectively couple the first memory unit to the processor control port, and the first processor input port to one of the second and third memory units for each cycle of the primary frequency so that newly received digital electrical power signals may be continually processed by the processor for a predetermined number of cycles.

DETAILED DESCRIPTION OF THE INVENTION

Conventional analog-to-digital conversion frequently involves use of oversampled analog-to-digital converters, such as those employing sigma-delta modulators. Systems in which analog-to-digital converters and sigma-delta modulators may prove useful are described in U.S. Pat. No. 5,181,033 entitled "Digital Filter for Filtering and Decimating Delta Sigma Modulator Output Signals," by Yassa et al., issued Jan. 19, 1993, U.S. Pat. No. 5,126,961, entitled "Plural-Channel Decimator Filter, as for Sigma-Delta Analog-to-Digital Converters," by Garverick, issued Jun. 30, 1992, U.S. Pat. No. 5,134,578, entitled "Digital Signal Processor for Selectively Performing Cordic, Division or Square-Rooting Procedures," by Garverick et al., issued Jul. 28, 1992, U.S. Pat. No. 4,951,052, entitled "Correction of Systematic Error in the Oversampled Analog-to-Digital Converters," by Jacob et al., issued Aug. 21, 1990, and U.S. Pat. No. 4,896,156, entitled "Switched-Capacitance Coupling Network for Differential-Input Amplifiers Not Requiring Balanced Input Signals," by Garverick, issued Jan. 23, 1990, all of the foregoing patents being assigned to the assignee of the present invention and herein incorporated by reference. Such systems are also described in "A Programmable Mixed Signal ASIC for Power Metering," by S. L. Garverick, K. Fujino, D. T. McGrath, and R. D. Baertsch, IEEE Journal of Solid State Circuits, Vol. 26, No. 12, December 1991, pp. 2008–16, and "A Programmable Mixed Signal ASIC for Power Management," by D. T. McGrath, P. Jacob, and H. Sailer, IEEE 1992 Custom Integrated Circuits Conference, pp. 19.4.1–19.4.2, both of which are herein incorporated by reference.

Figure 1:
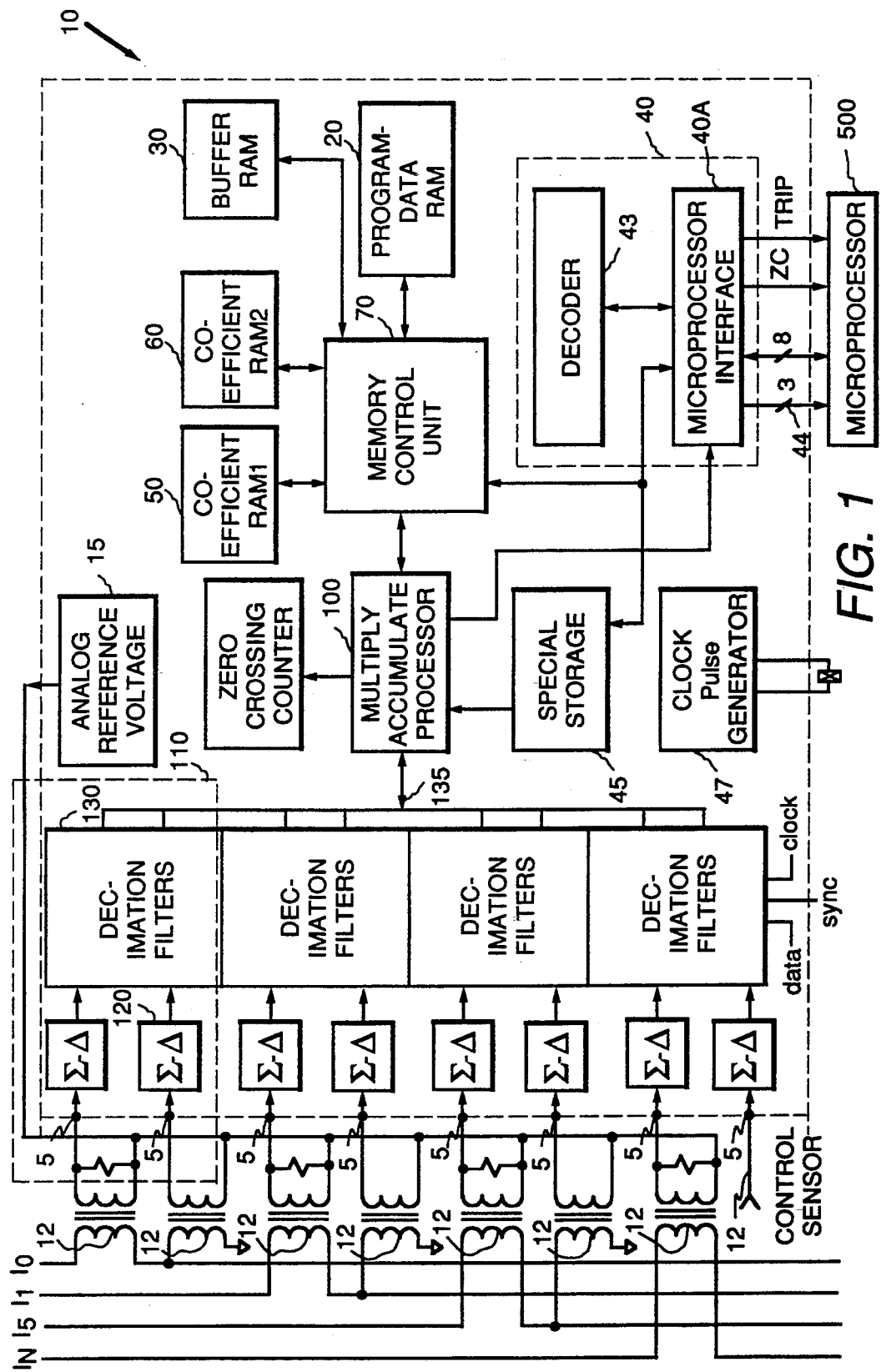
FIG. 1 is a schematic diagram of an embodiment of a programmable digital signal processor system in accordance with the invention.
Figure 15A:
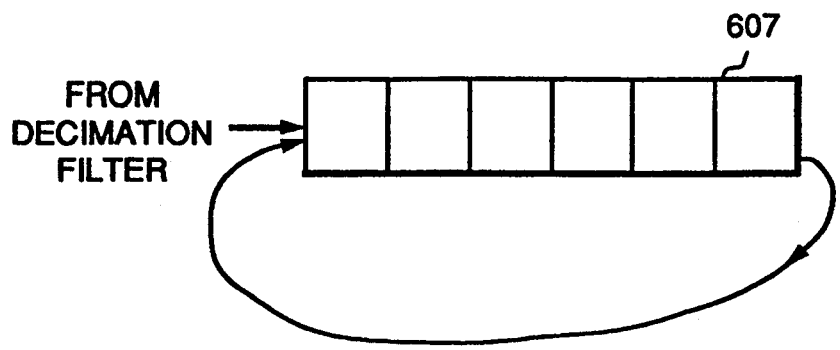
FIG. 15a and 15b are, respectively, embodiments of a cyclical register and a latch coupled to a shift register such as may be employed in conjunction with an analog-to-digital converter system for incorporation in a programmable digital signal processor system in accordance with the invention.
Figure 15B:
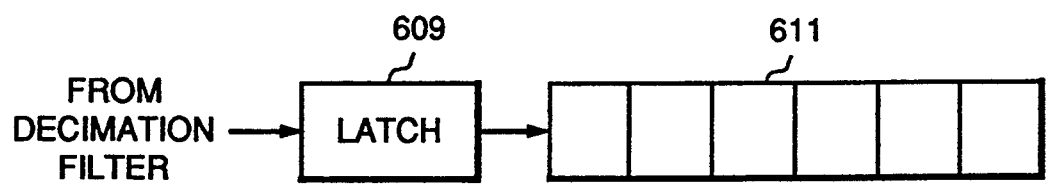

One embodiment of a programmable digital signal processor system or device for processing electrical power signals in accordance with the invention is illustrated in FIG. 1. The embodiment comprises a monolithic electronic integrated circuit (IC) 10 having input ports 5 which couple or interface to eight external sensors 12 producing analog electrical signals providing power measurements, such as substantially instantaneous current or voltage signals, to the IC. The analog signals constitute substantially continuous, substantially alternating electrical signals substantially having a primary or fundamental frequency. Device 10 is intended to operate in conjunction with analog electrical signals that are continuous, alternating, and have a fundamental or primary frequency, typically 60 Hertz frequency; however, the signals may deviate at times due to any one of a number of anomalous conditions. The IC converts these analog signals to bit-serial digital signals by means of an analog-to-digital converter system 110 comprising two delta-sigma modulators 120, and a decimation filter 130. In this particular embodiment, converter system 110 is arranged in a configuration permitting two delta-sigma modulators to be time-multiplexed to one decimation filter for more efficient utilization of resources, as described in copending U.S. application Ser. No. 07/653,935, (RD-20,882); however, the invention is not limited in scope to this configuration. The converter system 110 is coupled to a parallel-to-serial interface (not shown) which may comprise a cyclical register, as illustrated in FIG. 15a, coupled to the output of the decimation filter or a latch coupled to a shift register, as illustrated in FIG. 15b.

As illustrated, the IC also includes circuitry for performing multiplication. In this particular embodiment, 32-bit words or binary electrical signals, provided to a first input port of a processor, such as multiply-accumulate processor 100, are multiplied by a 16-bit word provided to a second input port and added to a 32-bit word provided to a third input port, thereby providing a processor output signal in the form of a 32-bit word which may be stored in a memory unit, such as a random access memory, and used for further processing. A number of embodiments of an arithmetic processor are possible and the invention is not limited in scope to this particular embodiment. As suggested, the arithmetic unit for performing the binary or digital signal processing in this embodiment comprises multiply-accumulate arithmetic processor (or MAC) 100, such as illustrated in FIG. 1 and shown in more detail in FIG. 5. Device 10 has the capability to couple the input ports 102, 103, and 104 of the multiply-accumulate processor, respectively illustrated in FIG. 5, to one of a number of sources. The device or system architecture illustrated results in a flexible, programmable signal processor capable of performing complex digital signal processing of binary electrical signals, including such operations as integration, differentiation, squaring, threshold detection, linear filtering, spectral analysis, polynomial expansion, and others.

Figure 3:
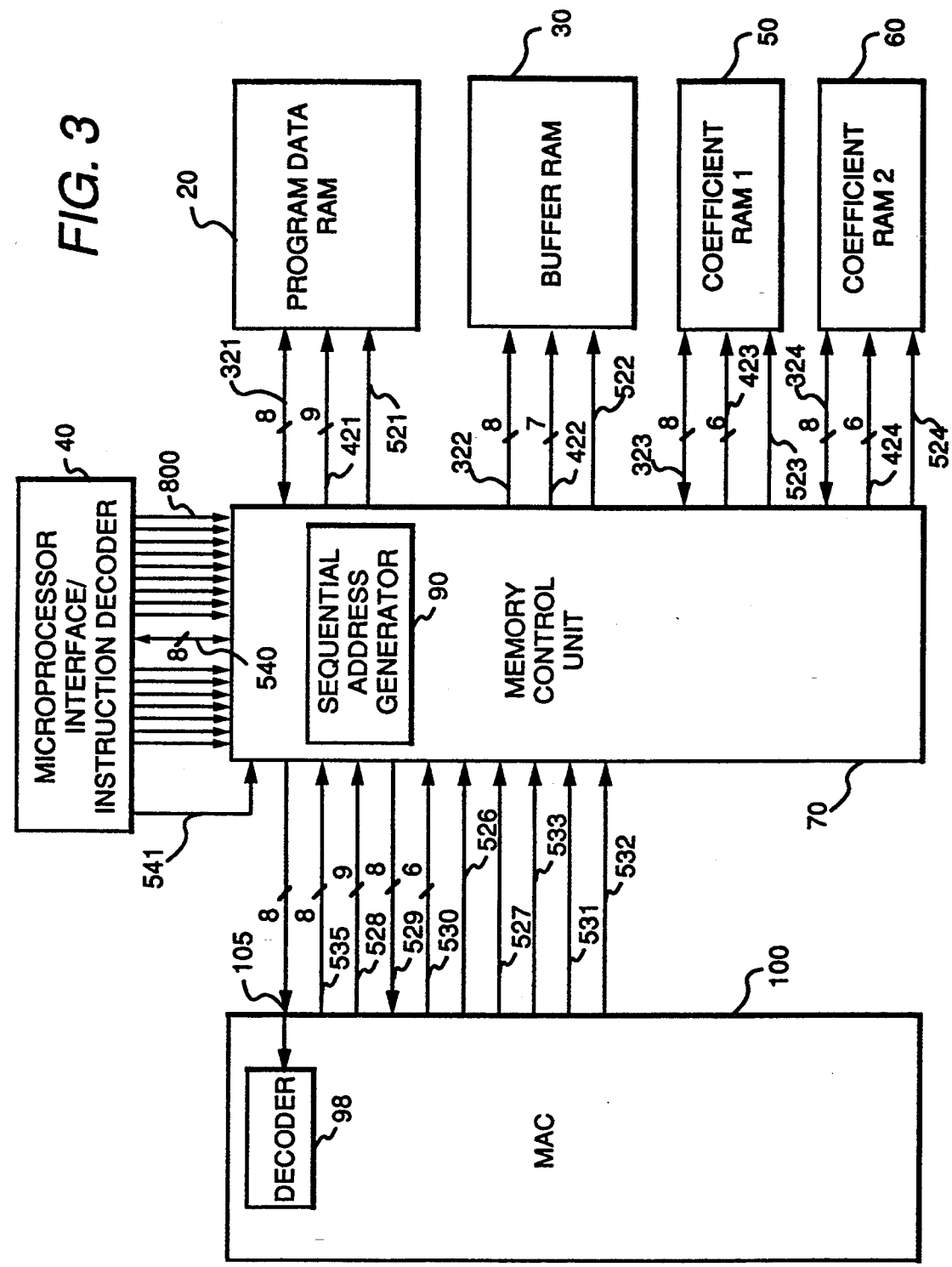
FIG. 3 schematically illustrates in more detail portions of the embodiment illustrated in FIG. 1.

Multiply-accumulate arithmetic processor 100 has a processor control port 105, shown in FIG. 3, that is responsive to predetermined processor control signals in order to perform predetermined arithmetic operations, including standard Boolean arithmetic, on binary input signals provided to the input ports. Externally derived processor control signals may be stored in a memory unit, such as "program/data RAM 20" illustrated in FIG. 1. In this particular embodiment, the externally derived control signals constitute a "program" of 64 32-bit word instructions or electrical control signals, which are executed on each set of input signals provided to the processor input ports, such as from the analog-to-digital converters. MAC 100 includes a conventional instruction or control signal decoder 98 illustrated in FIG. 3 which may comprise other conventional digital electronic circuitry or a "table-lookup" embedded in a conventional read only memory (ROM).

MAC 100 permits digital signal processing to be performed through various combinations of multiplicative, additive, and logical binary operations. As previously described, the MAC has a control port for receiving control signals or instructions stored in memory unit 20. The control signals indicate which predetermined digital operations the MAC shall perform on the input signals provided at its input ports as well as direct the flow of the MAC output signals and select the source of the MAC input signals. Thus, in the embodiment illustrated in FIG. 1, the control signals stored in memory unit 20 select the input signals to the input ports of the MAC from various possible sources, including signals from the analog-to-digital converter output port 135, the memory locations of memory unit 20 storing prior "intermediate" MAC output signals, or output signals from the MAC directly fed back without any intermediate storage in a memory unit.

Likewise, in this embodiment the MAC control signals indicate the memory location addresses within the memory unit in which to store the output processor signals. As illustrated in more detail in FIG. 3, these memory addresses are provided on data buses to memory units incorporated in device 10. Thus, in a typical signal processing cycle, termed an "integration period," memory control unit 70 will direct intermediate processor output signals to memory locations in memory unit 20 and will direct the ultimate or final processor output signals to memory locations in memory unit 30 in response to memory unit control signals provided by processor 100. The processor output signals then become accessible to an external microprocessor, such as microprocessor 500 (FIG. 1), through a microprocessor interface 40, as described hereinafter.

Figure 5:
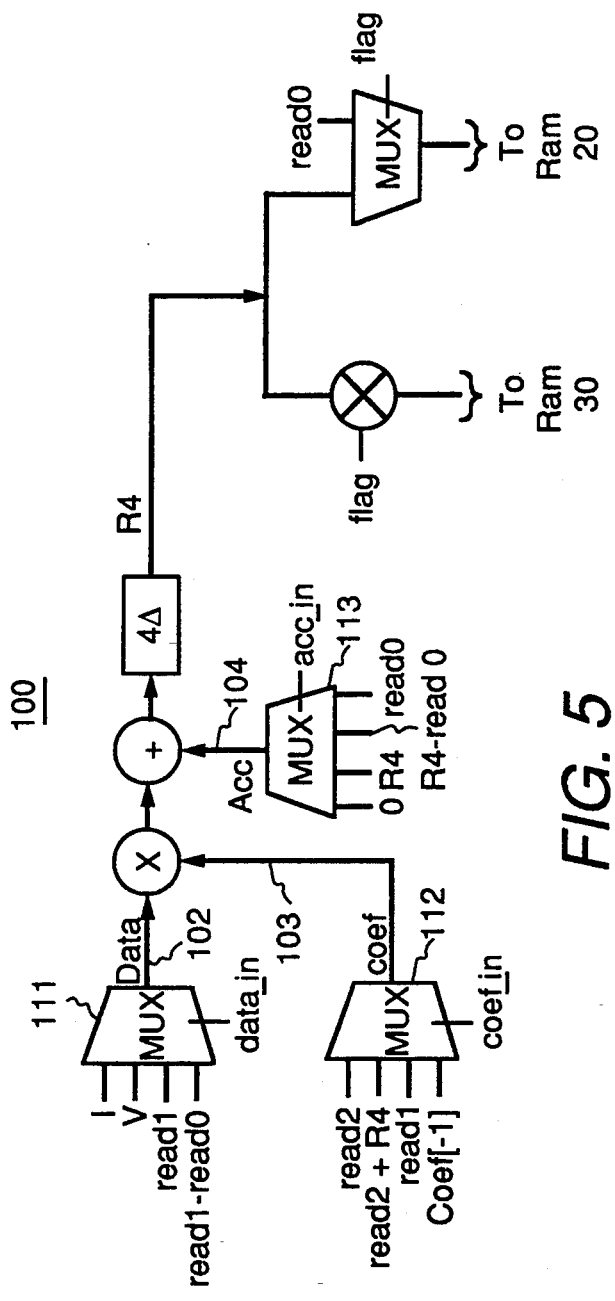
FIG. 5 is a schematic diagram of one embodiment of a multiply-accumulate processor for incorporation in a programmable digital signal processor system in accordance with the invention.

FIG. 5 is a schematic diagram of one embodiment of a processor 100 that may be incorporated in device 10 illustrated in FIG. 1. As illustrated, the processor has three input ports 102, 103, and 104, respectively, and an output port R4. The processor control path is not shown. Two of the input ports, designated Data and Coef, respectively, provide input signals to the multiplier portion of processor 100 and the third input port, Acc, provides an input signal to the accumulator portion that may be accumulated with the multiplication product of the input signals to ports 102 and 103. Likewise, as illustrated in this particular embodiment of the processor, three four-to-one multiplexers, 111, 112, and 113, are respectively provided at each input port so that input signals may be provided to processor 100 from various sources, as previously described.

As described, the processor output signals may be provided through memory control unit 70 (shown only as a conductive path in FIG. 5, for simplicity) either to memory unit 20 for storage or alternatively to another memory unit for storage, such as "buffer" RAM 30 illustrated in FIG. 1. This provides the capability for output signals to be stored in memory unit 20 during intermediate processing whereas, at the completion of the digital signal processing, the output signals are stored in memory unit 30, which may ultimately be accessed by, or indirectly coupled to, external microprocessor 500, while multiply-accumulate processor 100 continues to process newly arriving binary signals or data. Thus, the output signals stored in memory unit 30 are "read" by the microprocessor through microprocessor interface 40 during processing of the next set of power measurement input samples or signals.

In addition to the capability to direct output processor signals to different memory units depending upon when the digital signal processing is complete, device 10 also includes two additional memory units: memory unit 50, or coefficient RAM 1, and memory unit 60, or coefficient RAM 2, each for storing a separate plurality of processor input signals. In this particular embodiment, these memory units store coefficients in a binary electrical signal format to be provided to one of the input ports of the multiply-accumulate processor during the processing of quantized binary electrical signals provided to the processor by one of the analog-to-digital converters, such as converter 110. These memory units in effect store the coefficients to be used by the multiply-accumulate processor in executing the digital signal processing. Including two such memory units instead of one to store the coefficients provides the capability for the device to switch between the memory units so that while one set of coefficients is being employed in signal processing, the other set of coefficients may be modified adaptively based on the output processor signals previously provided to memory unit 30 and read by the external microprocessor. These two features, that is alternate coefficient memory units and alternate memory units for storing the output processor signals, with appropriate synchronization of the signal processing, provide the capability for the device to adaptively modify the digital signal processing being performed by the processor in real-time based on the output processor signals. Furthermore, this adaptive processing capability may be accomplished without any human intervention once the desired programs, or digital signal processes, are determined.

As suggested above, two memory units, 50 and 60, are each for storing a separate plurality of binary input signals. Memory control unit 70 has the capability to couple one or the other memory unit to the MAC during any given cycle of the primary frequency, as illustrated in FIG. 3 and explained in more detail hereinafter. The other or remaining memory unit is then available to the external microprocessor, through microprocessor interface 40, so that the coefficients may be modified or verified. Furthermore, external microprocessor 500 may provide electrical signals to memory control unit 70 through microprocessor interface 40, so that memory control unit 70 may on the next cycle of the primary frequency switch the memory unit providing coefficients for signal processing to the processor. This is accomplished as follows: microprocessor issues or provides a signal to memory control unit 70, through microprocessor interface 40, indicating that it has successfully modified or verified the electrical signals stored in one of the coefficient RAMs, such as memory unit 50 or 60. Having receiving this signal from microprocessor 500, memory control unit 70 switches the coefficient memory units at the beginning of the next integration period, signaled by MAC 100, to memory control unit 70. Thus, a signal from microprocessor 500 indicates that the coefficients have been modified or verified. With the other memory unit now available to microprocessor 500 after switching coefficient memory units, again through microprocessor interface 40, the coefficients may again be verified or, alternatively, modified in accordance with programing stored in microprocessor 500 processing the output signals available to the microprocessor from memory unit 30. As will now be appreciated by one skilled in the art, the ability of the microprocessor to signal the memory control unit and initiate the exchange of memory units 50 and 60 and to verify or modify the coefficients adaptively provides a reliability enhancement feature for the device.

Memory control unit 70, as illustrated in FIG. 3, provides the capability to couple and decouple various memory units to and from various ports of processor 100 in response to various control signals. Memory control unit 70 in response to externally derived memory unit control signals, such as provided by microprocessor 500 (FIG. 1), has the capability to respectively couple memory unit 20 to the processor control port. Likewise, it may further couple one of the processor input ports to one of memory units 50 and 60 for each cycle of the primary frequency of the externally derived substantially continuous substantially alternating electrical signal that is provided to the input port of the appropriate analog-to-digital converter. Memory control unit 70 also has the capability to switch between the memory units at an appropriately synchronized time between any two successive cycles in response to MAC derived control signals once the microprocessor has provided a signal indicating verification or modification of the coefficients, as previously described. This capability of the memory control unit ensures that quantized electrical signals produced by the converter are continually processed without interruption by the processor for a predetermined number of cycles of the primary frequency. Thus, memory control unit 70 further has the capability, in response to processor derived memory unit control signals, to couple one of the processor input ports to the output port of the cyclical register (if used as the parallel-to-serial interface for the analog-to-digital converters) and to switch between the two coefficient memory units while also directing signals from the processor output port between memory units 20 and 30 in synchronization with successive cycles of the primary frequency so that no data being converted to digital or binary form by the analog-to-digital converter is omitted from processing and, likewise, so that in conjunction with other device features, the digital signal processing may be modified in response to the output processor signals stored in memory unit 30.

FIG. 3 illustrates in more detail the paths for signals transferred between processor 100, memory control unit 70, microprocessor interface 40 and memory units 20, 30, 50 and 60. In addition to reference numeral designations, FIG. 3 also illustrates the number of binary signals that may be transferred between these respective components. As illustrated, the memory control unit incorporates a sequential address generator 90 which comprises a conventional counter specifically intended for use either when processor 100 provides processor output signals to memory unit 30 or alternatively when microprocessor 500 accesses the stored output processor signals from memory unit 30 through microprocessor interface 40. For the most part, memory control unit 70 comprises a plurality of multiplexers (not shown) in order to direct signals between the respective device components as specified. For example, as indicated, all four memory units 20, 30, 50 and 60 may either receive data from memory control unit 70 or provide data to memory control unit 70 on data links or lines 321, 322, 323, and 324, respectively. Likewise, each may receive an address from memory control unit 70 illustrated by address links 421, 422, 423, and 424, respectively, and each may receive a write signal from memory control unit 70 illustrated by links 521, 522, 523, and 524, respectively. Thus, when a write signal is provided, the arriving data on the data link is stored in the memory address location specified by the address link. Likewise, when no write signal is provided, data is provided from the memory address location specified on the address link to memory control unit 70 on the data link from the particular memory unit.

A number of electrical signals are provided from processor 100 to memory control unit 70 and from memory control unit 70 to processor 100. For example, as previously indicated, memory control unit 70 provides processor control signals to processor control port 105. These signals originate from memory control unit 20, and are properly directed through multiplexers, as previously described. Likewise, coupling or connections are provided from memory control unit 70 to processor 100 to supply stored electrical signals, such as coefficients from memory units 50 and 60. Processor 100 likewise provides signals to memory control unit 70. For example, the processor output signals are provided directly to memory control unit 70 on link 535. Likewise, memory control unit 70 provides this data directly to each of memory units 20 and 30 on a shared data bus. However, processor 100 also provides a signal, 526 or 527, to one of the two memory units, 20 and 30, respectively, to indicate that the data provided on its data links should be written into that particular memory. Thus, processor 100 will signal memory unit 20 or memory unit 30 depending upon whether the end of an integration period has occurred at the time the processor is providing output signals. Furthermore, this architecture provides the capability in some situations to provide processor output signals to memory unit 20 and memory unit 30 for storage in both memory units. Likewise, when processor 100 is providing data to memory unit 20 it may specify on address link 528 the address location in which that data is to be stored. Another set of links is directed to the situation in which processor 100 is obtaining coefficients from either memory unit 50 or 60. As will be appreciated by one skilled in the art, the processor does not indicate the memory unit from which to obtain coefficients. As previously described, this is controlled by signals from microprocessor 500 through microprocessor interface 40. Thus, processor 100 merely specifies on address link 530 the address in memory unit 50 or 60 from which to obtain the coefficients provided on data link 529. Likewise, processor 100 has a pair of signals to indicate when to begin writing to memory unit 30, provided on link 531, and when that period is complete, provided on link 532. As will be appreciated, this occurs at the end of an integration period. Likewise, signals, provided on link 533, coordinate the use of sequential address generator 90 so that processor 100 need not specify the addresses in memory unit 30 in which to store the processor output signals.

FIG. 3 also illustrates microprocessor interface 40 which includes interface circuitry 40A and an instruction decoder 43, as shown in FIG. 1. As illustrated by links 540, microprocessor interface 40 may transfer data to the memory control unit 70 and likewise receive data from memory control unit 70. Thus, the interface may either obtain data from the microprocessor and pass that data to memory control unit 70 or vice versa. Furthermore, microprocessor interface 40 receives instructions from the microprocessor, decodes those instructions and, as a result, provides signals on couplings or connections 800 to memory control unit 70 in order to ensure that those instructions are executed.

In addition to controlling the path of the electrical signals during processing in response to processor control signals provided by the external microprocessor through microprocessor interface 40 to memory unit 20, memory control unit 70 may also be employed to initiate wait mode for device 10. In wait mode, the MAC is decoupled from all inputs and outputs and the memory units are accessible to the external microprocessor through memory control unit 70 and microprocessor interface 40. This is accomplished by directing the flow of signals through memory control unit 70 using conventional multiplexers. In this mode, memory unit 20 may be "loaded" and "read back" by the microprocessor using sequential address generator 90 illustrated in FIG. 3. Likewise, in wait mode the microprocessor may read and write selected locations of memory unit 20 used for storing intermediate processor output signals. This is another reliability enhancing feature that may be performed to test the memory unit for defects in its storage capability. Likewise, the external microprocessor may initiate the same feature with respect to memory unit 30 to test for defects.

It will now be appreciated that microprocessor 500 may put device 10 (FIG. 1) into wait mode by providing externally derived memory unit control signals to memory control unit 70 through microprocessor interface 40 illustrated in FIG. 3 by link 541. This provides the capability for further adaptive modifications to the digital signal processing, although it will be appreciated that during the period in which the device is put into wait mode quantized electrical signals produced by one or more analog-to-digital converters will no longer be available to the MAC. Nonetheless, the external microprocessor may obtain these converter output signals from the decimation filters via pins or couplings described hereinafter and thus may store that information for later processing. Likewise, modifications in digital signal processing performed by the MAC may be made without "interrupting" the device by modifying the input signals in memory units 50 and 60, as previously described. The duration for which the device is placed in wait mode may also be controlled to ensure that little, if any, externally derived data is omitted by processor 100.

The external microprocessor may control exiting wait mode by providing memory unit control signals again through microprocessor interface 40. Again, this may be achieved using conventional multiplexers. This results in coupling or recoupling memory unit 20 to the processor control port so that the portion of the memory unit providing the processor control signals directs the operations to be performed on the newly arriving quantized electrical signals. As suggested previously, the microprocessor may now reaccess stored processor output signals from memory unit 30 and provide electrical signals to one of the two coefficient memory units, 50 and 60. Thus, in this particular embodiment, when "out" of wait mode the external microprocessor, through the microprocessor interface, has the capability to read and write 64 addressable bytes in one of the two memory units, 50 and 60. Likewise, switching between memory units 50 and 60 by microprocessor 500 occurs at the completion of each "integration period" as previously explained, after the microprocessor has either modified or verified the signals stored in the memory unit to which it has access through coupling provided by microprocessor interface 40. As previously discussed, this is a reliability enhancing feature which may be particularly useful in applications of the device 10 (FIG. 1) requiring that it be placed at a remote location for long periods of time, such as years. In this particular environment, power supply anomalies, ionizing radiation or other effects due to the environment of the device may affect its reliability. In particular power measurement applications, it might not be known until years later, if ever, that these problems occurred. However, through the mechanism of switching between the two coefficient memory units and verifying or modifying the signals stored, such memory unit failures may be detected early and corrected, typically without the need for human intervention or action.

As illustrated in FIG. 1, device 10 includes at least one analog-to-digital converter 110, including a sigma-delta modulator 120 and decimation filter 130, such as disclosed in the aforementioned patent application Ser. No. 08/025,456 (RD-22,053). Depending upon the decimation filter implementation, the filter may be coupled to a parallel to serial converter or interface. In the embodiment illustrated in FIG. 1, eight analog-to-digital converters are provided, all coupled to a cyclical register; however, as will be appreciated by one skilled in the art, device 10 is not limited in terms of the number of sigma-delta modulators or analog-to-digital converters. As illustrated, each analog-to-digital converter is responsive to an externally derived, substantially continuous, substantially alternating electrical signal substantially having a primary frequency, typically 60 hertz. Thus, in a typical power measurement application, each converter will be coupled to a current transformer or a potential transformer for each of the three phases in a typical three-phase network. As illustrated, an analog reference voltage 15 is also available on device 10, although the invention is not limited in scope in this respect. Likewise, in this embodiment, one current transformer will be provided to an analog-to-digital converter for neutral current and one input may be provided for a control related signal, such as temperature, pressure or any other control variable, depending upon the particular environment. The advantages of such a control sensor in this architecture are explained in more detail in later portions of this specification.

An alternative embodiment of decimation filter 130 is the filter disclosed in patent application Ser. No. 07/653,935 (RD-20,882), assigned to the assignee of the present invention and herein incorporated by reference. Possible filter embodiments are likewise disclosed in U.S. Pat. Nos. 5,126,961, titled "Plural-Channel Decimation Filter, as for Sigma-Delta Analog-to-Digital Converters," by Garverick, issued Jun. 30, 1962, and 5,134,578, titled "Digital Signal Processor for Selectively Performing Cordic, Division or Square-Rooting Procedures," by Garverick et al., issued Jul. 28, 1992, both assigned to the assignee of the present invention and herein incorporated by reference. As described, these filters provide 16-bit samples or signals at 4.883 kilohertz to one of the multiply-accumulate processor input ports for further processing. Employing the decimation filter embodiment described in co-pending patent application Ser. No. 08/025,456 (RD-22,053), the sigma-delta modulators digitize the analog input signal into a serial bit stream arriving at 2.5 megahertz when the device is clocked at a 10 megahertz nominal rate. Likewise, each of these decimation filters decimates the data or signal outputs from two modulators using time division multiplexing; nonetheless, alternative configurations may be employed.

As previously suggested, the output signals of the analog-to-digital converter are provided in a binary format. Thus, for more efficient utilization of storage capability only the sixteen most significant binary bits of the output signal are placed in the cyclical register. This provides satisfactory performance for this particular embodiment because the highest oversampling ratio implemented will be provided by R, the oversampling ratio, equal to 512, as described in patent application Ser. No. 08/025,456 (RD-22,053), which would require only approximately 12.5 bits for adequate resolution; however, by storing sixteen bits of the output signals provided, two 16-bit output signals may be stored in a 32-bit word for use with an 8-bit processor architecture. Likewise, as illustrated in FIG. 1, with eight analog-to-digital converters, output signals from any converter are made available every fourth 32-bit instruction. As described hereinafter, this is particularly suited for the pipeline structure implicit in the MAC and thus provides for efficient utilization of device resources.

Figure 2:
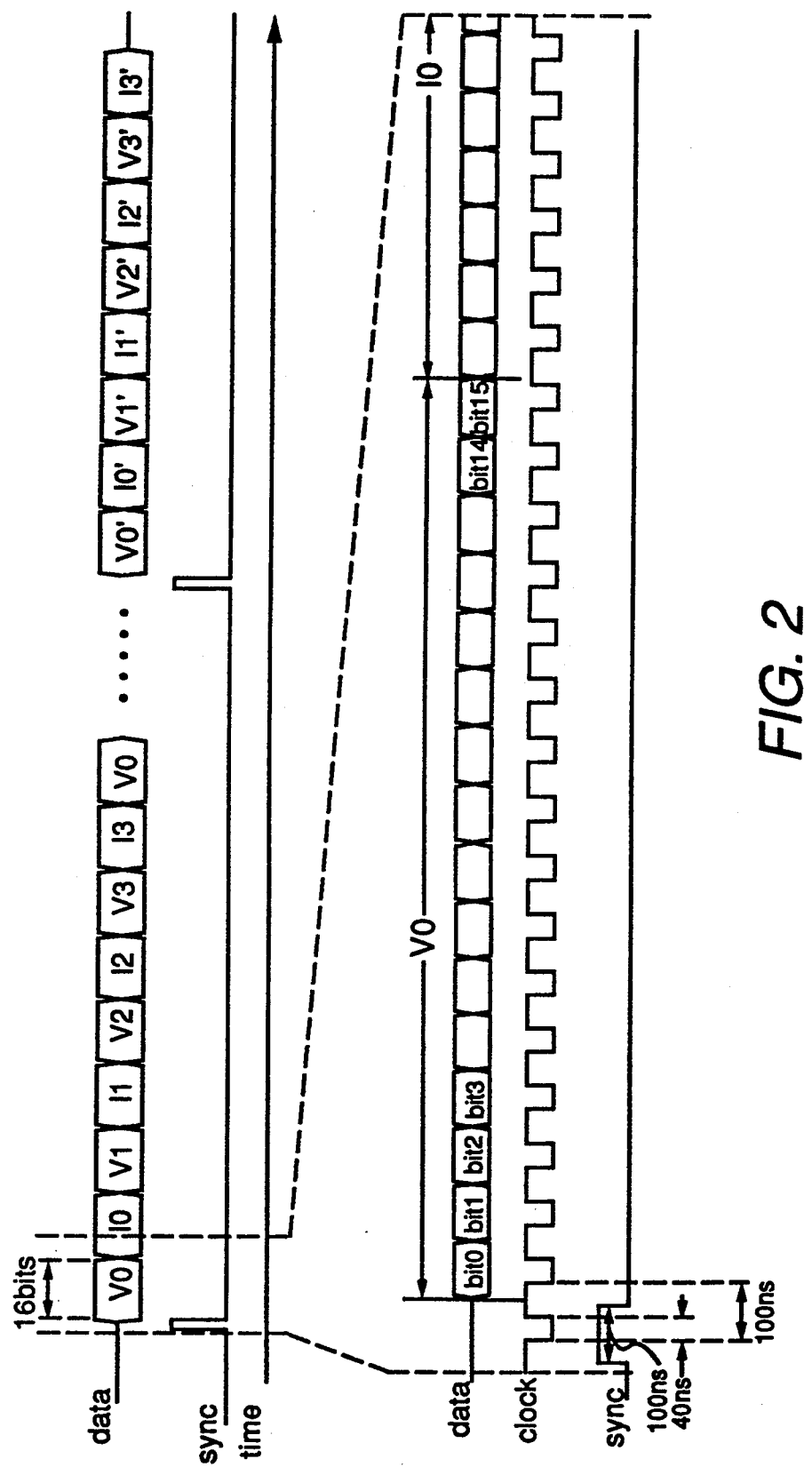
FIG. 2 is a timing diagram for quantized electrical power signal measurements capable of being produced by analog-to-digital converters incorporated in the embodiment of the invention illustrated in FIG. 1.

As illustrated in the embodiment of FIG. 1, the output signals of the programmable decimation filters are made available through connections or couplings providing data and synchronization signals. These output signals may be made available off the chip or device through terminals "data," "sync," and "clock," such as by coupling the filter outputs to a second latch and shift register (not shown). FIG. 2 illustrates the timing associated with these signals. As illustrated, voltage and current for each phase of a conventional three phase system is provided together on the coupling or terminal designated data. That is, the data or output signals provided from the analog-to-digital converter are latched and placed in a cyclical register in the order $V_0 I_0 V_1 I_1 V_2 I_2 V_3 I_3$ so that each corresponding voltage and current are provided successively. Likewise, the terminal "sync" provides a signal indicating the beginning of the eight output signals or the beginning of the four 32 bit words. Likewise, as illustrated in detail in FIG. 2 the output signals are provided in bit serial form and the correspondence with the clock pulse of device 10 provided by clock pulse generator 47 is illustrated.

These connections or couplings provide a mechanism to store or display the data from the modulators after filtering at different selected decimation rates that trade-off bandwidth for resolution, as described in the aforementioned patent applications Ser. No. 08/025,456 (RD-22,053) and Ser. No. 08/036,742 (RD-21,788). Likewise, the output signals from these programmable decimation filters may be provided directly to multiply-accumulate processor 100 in order to perform digital signal processing immediately. The decimation ratio for the programmable decimation filters may be controlled through a status register, as described hereinafter. Thus, the device further has the capability to trade off bandwidth and resolution in an adaptive feedback process depending upon the processor output signals provided to memory unit 30.

In the embodiment illustrated in FIG. 1, memory unit 20 comprises a random access memory having 512 bytes of memory. In this embodiment, half of the memory unit is dedicated to storing processor control signals, the processor control signals constituting 64 32-bit program instructions or 256 8-bit bytes. In accordance with externally derived memory control signals provided to memory control unit 70, intermediate processor output signals are provided to memory unit 20 to be stored in the remaining 256 bytes. In this particular embodiment, the digitized signals arrive at a frequency of 4.883 kilohertz and are processed by MAC 100 over a predetermined number of samples or signal outputs of the converter, designating the "integration period." Likewise, each memory unit storing coefficients, such as units 50 and 60, also stores a "coefficient" controlling the length of the integration period or the number of converter signal outputs to be processed during each cycle of the primary frequency. This, in effect, determines the number of cycles for the flow chart illustrated in FIG. 4 and described hereinafter. Typically, the integration period is one-half cycle or one cycle of a 60 hertz frequency, although this may be modified adaptively or as needed by external microprocessor 500. At the end of the predetermined integration period, the processor output signals are provided to memory unit 30 again in accordance with processor derived memory unit control signals. Thus, memory unit 30 is available to the external microprocessor via microprocessor interface 40 during the next successive integration period, which typically will constitute the next cycle of the primary frequency. This is accomplished in the following manner: External microprocessor 500 provides an electrical signal to "read" the electrical signals stored in memory unit 30 through microprocessor interface 40. Memory control unit 70 responds to this signal from the microprocessor 500 and directs 128 bytes of sequential memory from memory unit 30 to be presented on the 8-bit microprocessor interface bus illustrated in FIG. 3. To accomplish this operation, memory control unit 70 uses sequential address generator 90.

Synchronization between integration periods so that the external microprocessor may read the processor output signals stored in memory unit 30 is further accomplished through the use of a status register such as may be incorporated in memory unit 45 or elsewhere in device 10, available to microprocessor 500, shown in FIG. 1, through microprocessor interface 40. In this particular embodiment, the status register is continuously updated during device operation. Thus, an instruction to microprocessor interface 40 from microprocessor 500 transfers the contents of the eight bit status register to the microprocessor through microprocessor interface 40, illustrated in FIG. 1 by data link 44. This particular embodiment may include a bit indicating that a device is in wait mode. Thus, the bit is cleared when wait mode is exited. Likewise, the register may include a bit indicating that memory unit 30 has been completely updated and a bit indicating that memory unit 30 was read by the external microprocessor at the same time it was being accessed by processor 100. In the latter situation the circuitry permits the processor to dominate the external microprocessor so that the data is successfully entered into memory unit 30 and may be accessed later by the microprocessor. Likewise, the status register includes a bit indicating that the zero cross counter, described in more detail later, has been updated. It will be appreciated by one skilled in the art that the invention is not limited in scope to this particular status register and, likewise that many other bits may be provided to indicate the condition of device 10 to external microprocessor 500.

Thus, typically, at the end of an integration period, final processor output signals are directed to memory unit 30 using sequential address generator 90 in memory control unit 70 that likewise may be employed by external microprocessor 500 to read and write MAC control signals to memory unit 20 through microprocessor interface 40 when device 10 is in wait mode. Thus, efficiency results from the capability of the circuitry to be shared by an external microprocessor and the MAC.

As previously indicated, in the embodiment illustrated in FIG. 1 the minimum conversion rate for the analog-to-digital converter is fsd/512, where fsd is the sigma-delta modulator sampling frequency. Likewise, as previously described for each signal output to be processed by the MAC, 64 instructions or control signals will be provided to the MAC to process a particular processor input signal. Likewise, each instruction should require on the average 32 clock cycles because the architecture operates serially for 32-bit fixed point processing. Thus, as will now be appreciated, device 10 has an architecture structure designed to relieve external microprocessor 500 of the burden of processing converter output signals at the sample rate. Thus, for typical examples of digital signal processing using the MAC, integration period T specifies the number of quantized converter output signals to process for each cycle of the primary frequency. The MAC control signals stored in memory unit 20 are repeated T-1 times, with the processor output signals on each pass being stored in memory unit 20 and, on the last pass (that is, the final pass in the integration period), the data is directed to memory unit 30, as a consequence of signals to memory control unit 70, to be read by external microprocessor 500. Likewise, as previously indicated, signals to memory control unit 70 may permit writing output signals to memory units 20 and 30 at the same time.

Figure 4:
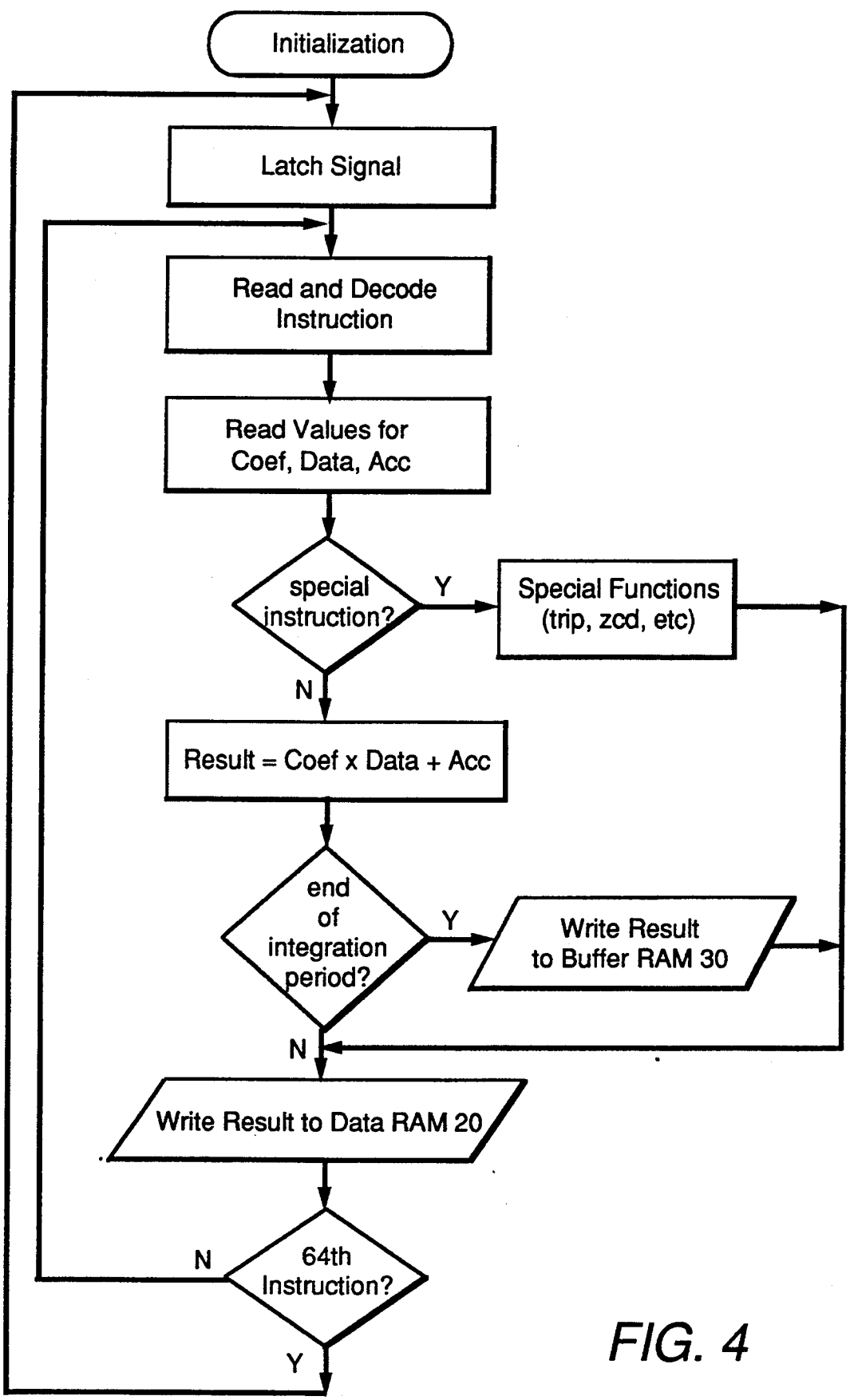
FIG. 4 is a simplified flow chart for signal processing capable of being performed by the embodiment illustrated in FIG. 1.

FIG. 4 is a flow chart showing this operation of the embodiment of device 10 illustrated in FIG. 1. First, a conventional initialization is performed before the initiation of the processing of converter output signals. A cyclic operation is then begun with the period of integration specified as previously described. During this integration, 64 instructions are provided to the MAC to be executed for T consecutive converter output signals or samples. The execution of each set of control signals, considered with the apparatus illustrated in FIG. 1, is as follows. First, one instruction or set of control signals is read from memory unit 20 and decoded by processor 100. The addresses in each set of control signals are provided to the memory control unit so that these values may be provided from the respective memory units to the input ports of the MAC. Since the MAC is a bit serial processor, in this particular embodiment these electrical signals must be converted from a parallel signal or word to a serial data stream for processing by the MAC. Thus, a quantized electrical signal then is latched to a register for parallel to serial conversion. One advantage of performing the parallel to serial conversion within the MAC is that it permits the memory control unit to process signals asynchronously. As these input signals are provided to the input ports of the MAC, the processing by multiplication and accumulation occurs. However, as indicated in FIG. 4, selected processor control signals may indicate that special processor functions be performed. These include threshold detection (trip) or zero cross detection (Zcd). During this cycle the intermediate processor output signals are provided to memory unit 20 and the next set of control signals for the MAC is executed. When the end of the integration period is reached, the MAC output signals may be provided to memory unit 30 and the next converter output signal is latched.

The flow chart provided in FIG. 4 does not incorporate the time delay introduced by the bit serial nature for the processor illustrated in FIG. 5. Due to the serial nature of the processor, processing of a single converter output sample or signal in this embodiment requires 128 clock cycles. However, four instructions may be pipelined during these 128 clock cycles because with use of this architecture use of instructions or control signals of 32 bits in length is contemplated. As previously discussed, the processor is thus particularly suited for use with the cyclical register and analog-to-digital converters discussed in connection with FIG. 1 in that the output signal of each converter will be available to the processor on every fourth instruction.

Device 10 includes a number of features to accomplish the operations in the architecture previously described. For example, although the invention is not limited in scope to this particular embodiment, FIG. 1 illustrates a memory unit 45 for the storage of signals particularly useful in the power metering, measurement and management embodiment. Several values that are frequently altered or monitored by external microprocessor 500 may be stored in registers in this memory unit. Table 1 below provides three examples: "overthreshold counting," or threshold detection (trip), "zero cross timing," or zero cross detection (Zcd) and "waveform capture rate" or decimation ratio. Waveform capture rate controls or specifies the decimation ratio previously described. Thus, microprocessor 500 may provide this rate through interface 40. Overthreshold counting determines, for the signals provided by the analog-to-digital converters, the number of consecutive signals or samples exceeding a predetermined threshold. When this has occurred, as indicated by a register in memory unit 45, some action may be taken by microprocessor 500, such as disconnecting power or some other remedial action due to the fact that a power signal measurement has continued to exceed its normal or expected limits. For this reason, as illustrated in FIG. 1, these signals are provided to microprocessor 500. As illustrated, this feature has the advantage that it may check for consecutive overthreshold samples or signals before performing such an interrupt in order to ensure that it is not simply a power line transient or other short-lived problem not requiring disconnection. Likewise, this feature may be controlled adaptively by the external microprocessor, such as may be accomplished as previously described with respect to coefficient memory units 50 and 60. Likewise, memory unit 45 may include or store signals regarding zero cross timing. This may specify the number of zero crossings in a predetermined duration, such as an integration period. This is particularly important in connection with the adaptive feedback control previously described. This provides an independent measurement of the fundamental or primary frequency of the externally derived electrical signal being sampled or digitized. Thus, the number of zero crossings may be used adaptively to change the integration period previously described.

TABLE 1

| Name | # bits | Function | Range | |
|---|---|---|---|---|
| Over-threshold Counting | 3 | Consecutive "Overthreshold" Samples before interrupting microprocessor | 0 thru 7 | |
| Zero Cross Timing | 6 | Minimum number of samples between consecutive zero crossings | 0 thru 63 | |
| Waveform Capture Rate | 3 | Select decimation ratio | Sample Rate, $f = f_{ds}/R$ | |
| | | | xx0 | 512 |
| | | | 001 | 32 |
| | | | 101 | 62 |
| | | | 011 | 128 |
| | | | 111 | 256 |

Figure 13:
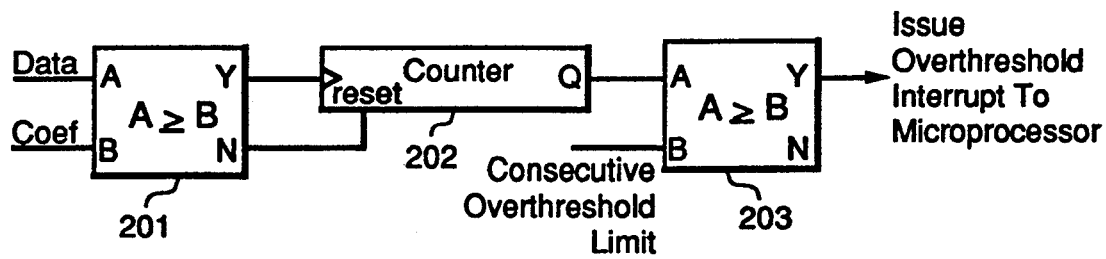
FIG. 13 illustrates an embodiment of a threshold detector such as may be incorporated in an embodiment of a programmable digital signal processor system in accordance with the invention.

In this embodiment the threshold detection is implemented as illustrated in FIG. 13. Thus, a comparator 201 may read a threshold value stored in one of the coefficient RAMS 50 or 60 and compare the Data value available through input port 102 of processor 100 to that threshold. If the threshold is exceeded, a counter 202 tracks consecutive "overthreshold" values and thus is incremented. Thus, the counter provides a filter of the false detections due to spurious noise artifacts. If the next sample does not exceed the threshold, counter 202 is reset. When the number of consecutive overthreshold values exceeds its limit, an interrupt signal is immediately provided to microprocessor 500 by a comparator 203. In this particular embodiment, the consecutive overthreshold limit is a 3 bit value written by the microprocessor. As illustrated in FIG. 13, the Data input is loaded with the present sample or electrical signal and the Coef input with the threshold stored in the coefficient RAM. Although FIG. 13 illustrates use of a counter in device 10, it will now be appreciated that the processor may be configured to operate as a conventional counter to reduce the amount of additional hardware needed.

Figure 10:
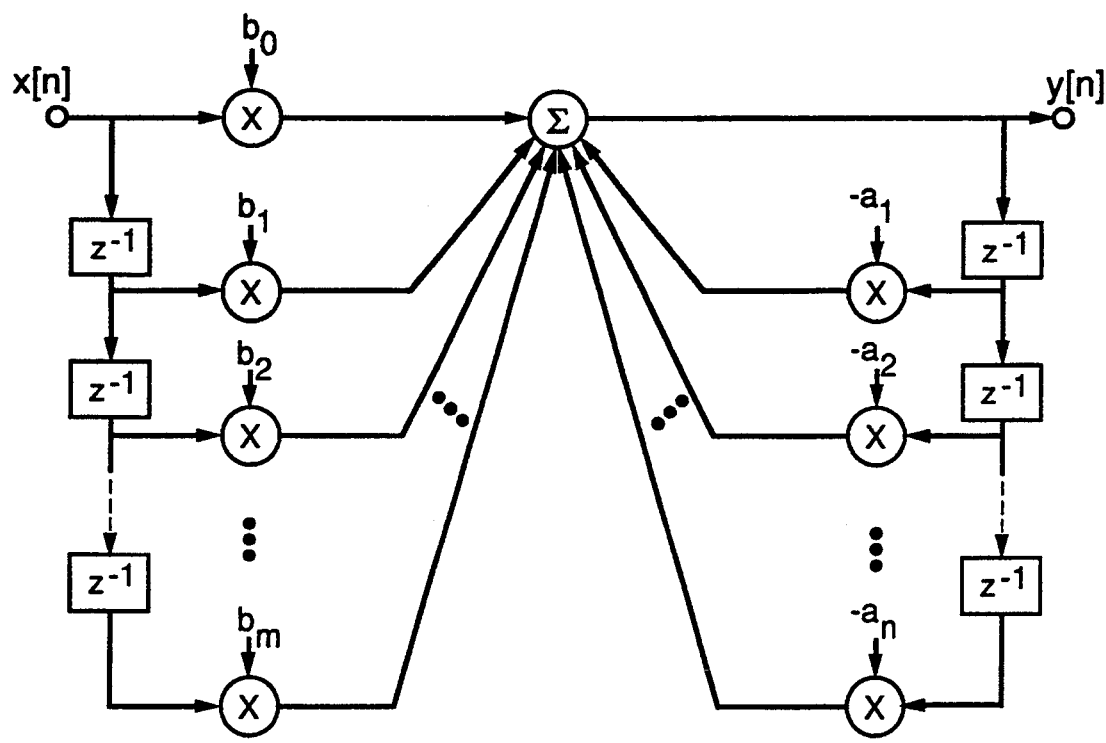
FIG. 10 illustrates a conventional realization of an Infinite Impulse Response (IIR) filter.
Figure 14:
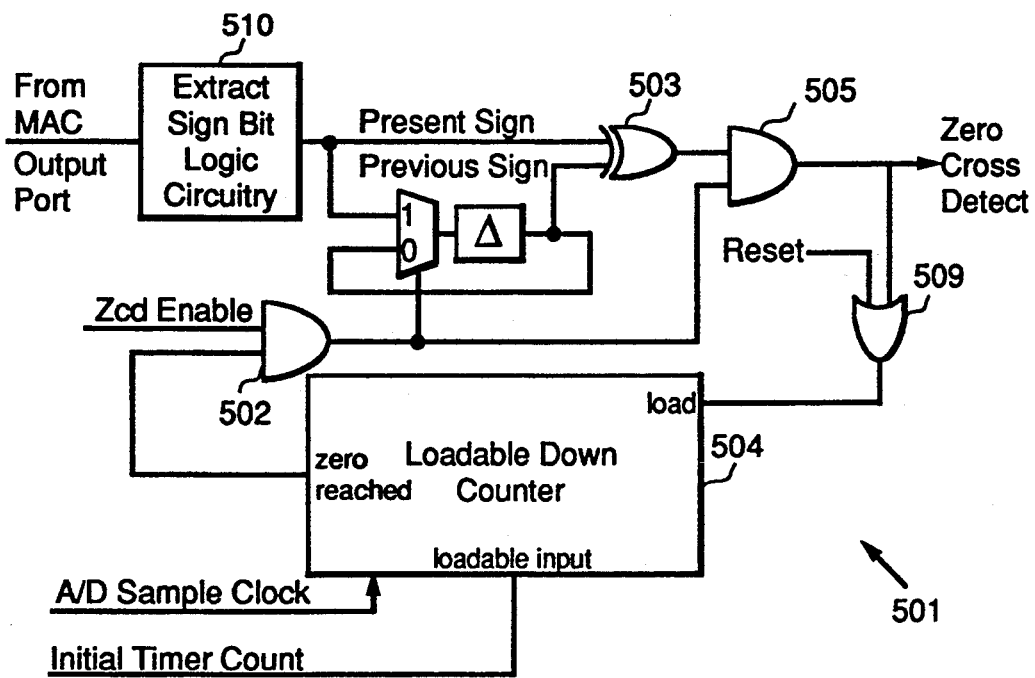
FIG. 14 illustrates an embodiment of a zero cross detector such as may be incorporated in an embodiment of a programmable digital signal processor system in accordance with the invention.

Likewise, in this particular embodiment the zero cross detection is accomplished, such as by a zero cross counter 501 illustrated in FIG. 1 and in FIG. 14 in more detail. The input port of the zero cross detection circuit comprising counter 501 is coupled to the output of processor 100. When the circuit, as shown in FIG. 14, is enabled by a gate 502, based on a control signal provided to processor 100, the sign bit of the current input signal or sample is extracted by logic circuitry 510 and provided through to an exclusive OR circuit 503 that extracts sign bits from the previous input signal. If the sign bit is changed, AND gate 505 becomes active. Other circuitry provides a minimum interval between successive zero crossings. This acts as a programmable noise filter in that the zero cross detection output signal cannot be enabled again until a loadable down counter 504 has counted down to zero. This feature is particular useful when the maximum input signal frequency is known, thereby preventing false zero cross detections due to noise on low amplitude signals. As illustrated, OR gate 509 permits the reset of counter 504 for testing or initialization on the application of electrical power. A similar zero cross detector likewise is illustrated in FIG. 10 of copending patent application Ser. No. 07/653,935 (RD-20,882).

Figure 6:
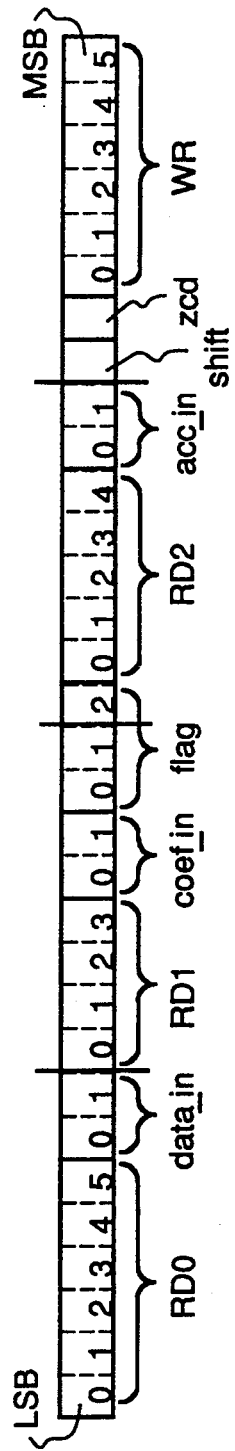
FIG. 6 illustrates an instruction format for control signals for the embodiment of a multiply-accumulate processor illustrated in FIG. 5.

FIG. 6 illustrates an instruction format that may be used for the control signals provided to processor 100. One skilled in the art will appreciate that the invention is not limited in scope to use of this particular instruction format. Rather any one of a number of different instruction formats may be employed and the format illustrated is merely intended as an example of one possible format. As illustrated by FIG. 6, each instruction in this particular embodiment is 32-bits wide with the least significant bit (LSB) first and the most significant bit (MSB) last. Thus, the instruction is stored in the program memory with the bits in increasing address location significance from left to right.

Figure 7A:
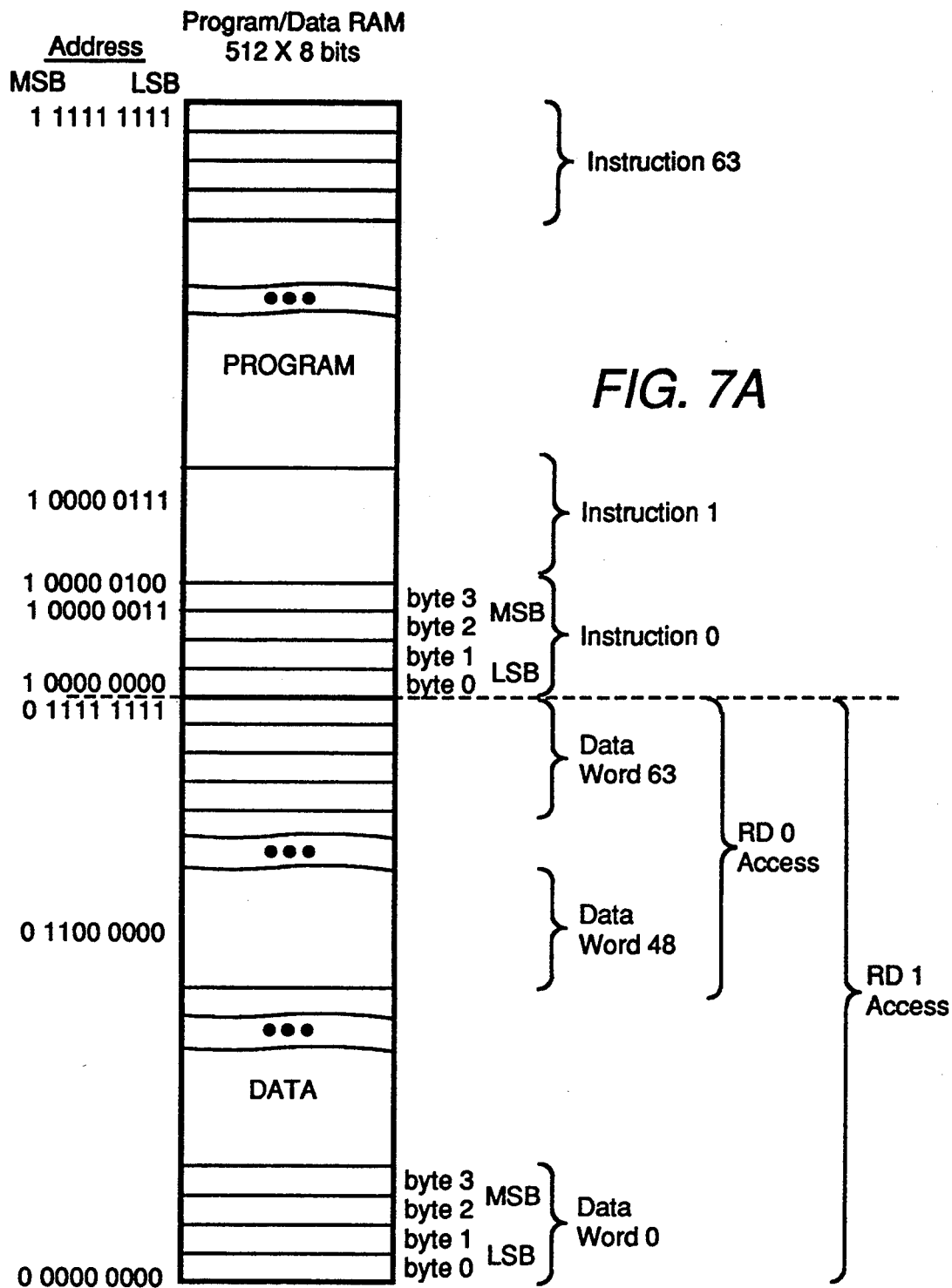
FIGS. 7A and 7B respectively are memory maps for memory units such as may be incorporated in a programmable digital signal processor system in accordance with the invention.
Figure 7B:
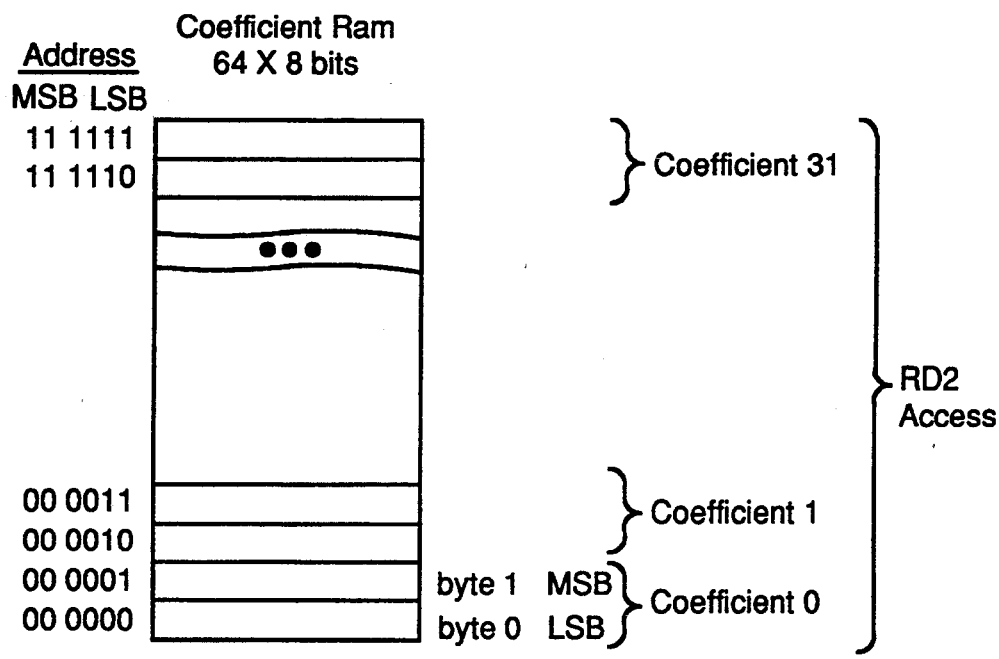

Table 2 below in conjunction with FIG. 5 provides the correspondence between different fields in the instruction format and the processor control signals. In particular, fields RD0, RD1 and RD2 in this particular embodiment correspond to these portions of memory units 20 and 30 (FIG. 1) which may be read from or written to, depending on the particular situation. The relevant portions of these memory units are illustrated in FIGS. 7A and 7B, which respectively provide a program/data RAM "memory map" for memory units 20 and 30. Likewise, as further illustrated by Table 2, instruction field variables data-in, coef-in, and acc-in permit processor 100 (FIG. 5) to select from one of a number of different sources of input signals for input ports 102, 103, and 104, respectively. Likewise, in this particular embodiment as illustrated in FIG. 6, a "Zcd" bit constitutes the signal from the processor for zero cross detection, a "shift" bit signals the processor to perform a shift and round operation, utilized to perform rounding rather than truncation, and three "flag" bits provide a number of different codes controlling various other functions of processor 100, as specified in Table 3 below. Likewise, Tables 4 and 5 below illustrate the correspondence between the source of input signals coupled to processor 100 input ports and the instruction format. It should now be apparent to one skilled in the art that the switching, or coupling and decoupling, that is performed by the memory control unit between memory units 50 and 60 is transparent to the processor in that from the "processors' standpoint" only one memory unit is coupled to an input port on any particular cycle of the primary frequency.

TABLE 2

| Field | Places | bits | Range | Function |
|---|---|---|---|---|
| RD0 | 0–5 | 6 | 0–63 | Address of read0 in Program/Data RAM |
| data-in | 6–7 | 2 | See Table 4 | Select Data |
| RD1 | 8–11 | 4 | 0–15 | Address of read1 in 4th Quadrant of Program/Data RAM. See FIGS. 7A and 7B. |
| coef-in | 12–13 | 2 | See Table 4 | Select coef |
| FLAG | 14–16 | 3 | See Table 3 | Select data flow |
| RD2 | 17–21 | 5 | 0–31 | Address of read2 in Coefficient RAM |
| acc-in | 22–23 | 2 | See Table 4 | Select Acc |
| shift | 24 | 1 | 0 or 1 | Shift and round during |

TABLE 2-continued

| Field | Places | bits | Range | Function |
|---|---|---|---|---|
| zcd | 25 | 1 | 0 or 1 | Latch MSB of result for zero cross detection accumulation |
| WR | 26–31 | 6 | 0–63 | Address for writing to Program/Data RAM |
| Total: | 0–31 | 32 | | |

TABLE 3

| FLAG | Function |
|---|---|
| 000 | write R4 to Data RAM - normal operation |
| 001 | write read0 to Data RAM |
| 010 | initialize Acc to zero at beginning of integration period |
| 011 | route trig init value to Data at beginning of integration period |
| 100 | write R4 to Buffer RAM on dumpout |
| 101 | enable counter operation - compare and increment |
| 110 | write R4 to Buffer RAM on dumpout and initialize Acc to zero at beginning of integration period |
| 111 | instantaneous trip threshold comparison |

TABLE 4

| Code bits | | Data Path Selected | | |
|---|---|---|---|---|
| MSB | LSB | data-in | coef-in | acc-in |
| 0 | 0 | I | read2 | zero |
| 0 | 1 | V | read2 + R4 | R3 |
| 1 | 0 | read1 | read1 | read0 + R4 |
| 1 | 1 | read0 | Coef[−1] | read0 |

TABLE 5

| Name | Meaning |
|---|---|
| read0 | Value read from the Program/Data RAM at address RD0 |
| read1 | Value read from the Program/Data RAM at address RD1 |
| read2 | Value read from the Coefficient RAM at address RD2 |
| Coef[−1] | The Coef value that was used in the previous instruction |
| R4 | Result of multiply-accumulate from instruction n-4. Available at instruction n as an input to the Acc and Coef muxes, or to be written to the Program/Data or Buffer RAM |
| I | Output of A/D converter I |
| V | Output of A/D converter V |

The embodiment of a multiply-accumulate processor illustrated in FIG. 5 operates in the following manner. The Data input signal at port 102 is selected based upon the instruction provided to the processor control port and decoded. In order to have access to all analog-to-digital converters, the decimated data is cycled in a cyclical register so that each sample is available every fourth instruction. As suggested in FIG. 2, after $I_3$, the sequence repeats, beginning with $V_0$, until a new set, beginning with $V'_0$ is available. Likewise, the Coef input signal at port 103 is selected based on the latched instruction provided by memory unit 20 (FIG. 1). As indicated in FIG. 5, Data may be either a sample (I or V) from one of the converters, a value (read1) read from memory unit 20 at address RD1, or the difference between a value (read1) read from Data RAM 20 at address RD1 and a value (read0) read from Data RAM 20 at address RD0. Likewise, the Coef input signal may be selected from a value (read2) read from a coefficient RAM, such as memory unit 50 or 60, at address RD2, the sum (read2+R4) of the value at address RD2 and the last result of the multiply-accumulate process, the value (read1) read serially from Data RAM 20 at address RD1, or the Coef input signal (Coef [−1]) that was used in the last instruction, again read serially. Finally, as illustrated in FIG. 5, the Acc input signal at port 104 may be selected from either zero, the last signal output (R4) of processor 100, the difference (R4−read0) between the last signal output of the processor and the value read from Data RAM 20 at address RD0, or the value (read0) at address RD0. It will now be appreciated by one skilled in the art that the difference of stored values provides a method for a single instruction implementation of a high pass filter which may be useful in the type of digital signal processing employed in power measurement, metering and management, as explained hereinafter. Likewise, as previously described the processor 100 output signal R4 is provided to either memory unit 20 for intermediate storage or at the end of the integration period to memory unit 30 (and memory unit 20, if desired) for transfer to external microprocessor 500 through microprocessor interface 40.

In accordance with the previous description, instructions provided to microprocessor interface 40 to facilitate communication with device 10 from microprocessor 40 may include:

| Instruction | Function |
|---|---|
| Read Status | Initiates read of status register |
| Clear Status | Clears status register |
| Write zero cross count parameters | Programs zero-cross counting parameters |
| Read zero cross count parameters | Verifies zero-cross counting parameters |
| Write tripnum wcsel | Programs number of samples over threshold before "trip", and programs the decimation ratio |
| Read tripnum wcsel | Verifies number of samples over threshold before "trip" and verifies the decimation ratio |
| Write checksum | Programs address to check program RAM 20 |
| Read checksum | Initiates read of data in specified RAM address in RAM 20 |
| Wait Mode request | Initiates wait-mode |
| End Wait request | Terminates wait-mode |
| Write Program RAM 20 | Initiates sequential write of 256 bytes of RAM 20 |
| Read Program RAM 20 | Initiates sequential read of 256 bytes of RAM 20 |
| Write Interface Buffer RAM 30 | Initiates sequential write of 128 bytes of RAM 30 |
| Read Interface Buffer RAM 30 | Initiates sequential read of 128 bytes of RAM 30 |
| Write coefficient RAM address | Initiates write to a coefficient RAM address |
| Write coefficient RAM value | Initiates write of value to specified coefficient RAM address |
| Read coefficient RAM address | Initiates read of a coefficient RAM address |
| Write Program RAM 20 address | Initiates write to a program RAM 20 address |
| Write Program RAM 20 value | Initiates write of value to specified RAM 20 address |
| Read Program RAM 20 address | Initiates read of a RAM 20 address |
| Coefficients OK | Initiates swap of coefficient RAMs on next integration period |

| Instruction | Function |
|---|---|
| Read zero cross count | Initiates read of count of zero crosses |
| Test Mode Request | Initiates test mode request |
| Test Mode Confirm | Initiates stare of test mode |

Figure 8:
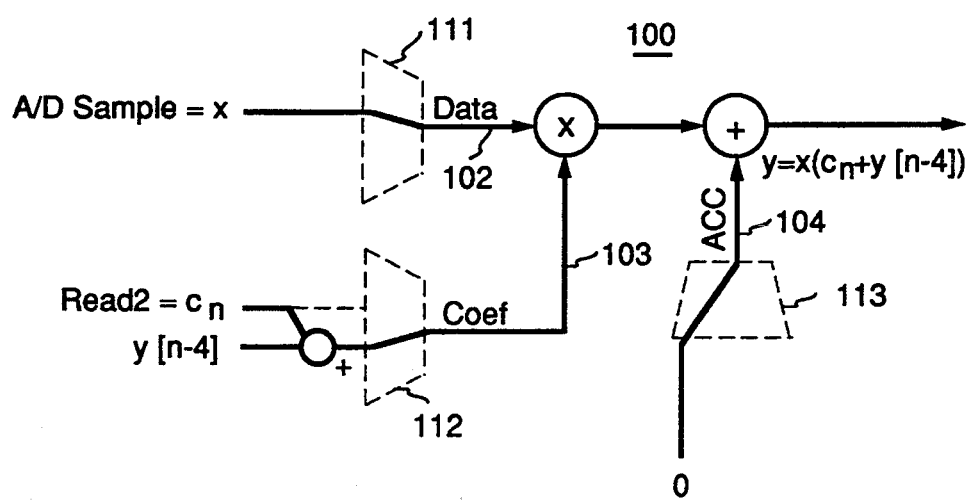
FIG. 8 illustrates one embodiment of a configuration of a programmable digital signal processor system in accordance with the invention.
Figure 9:
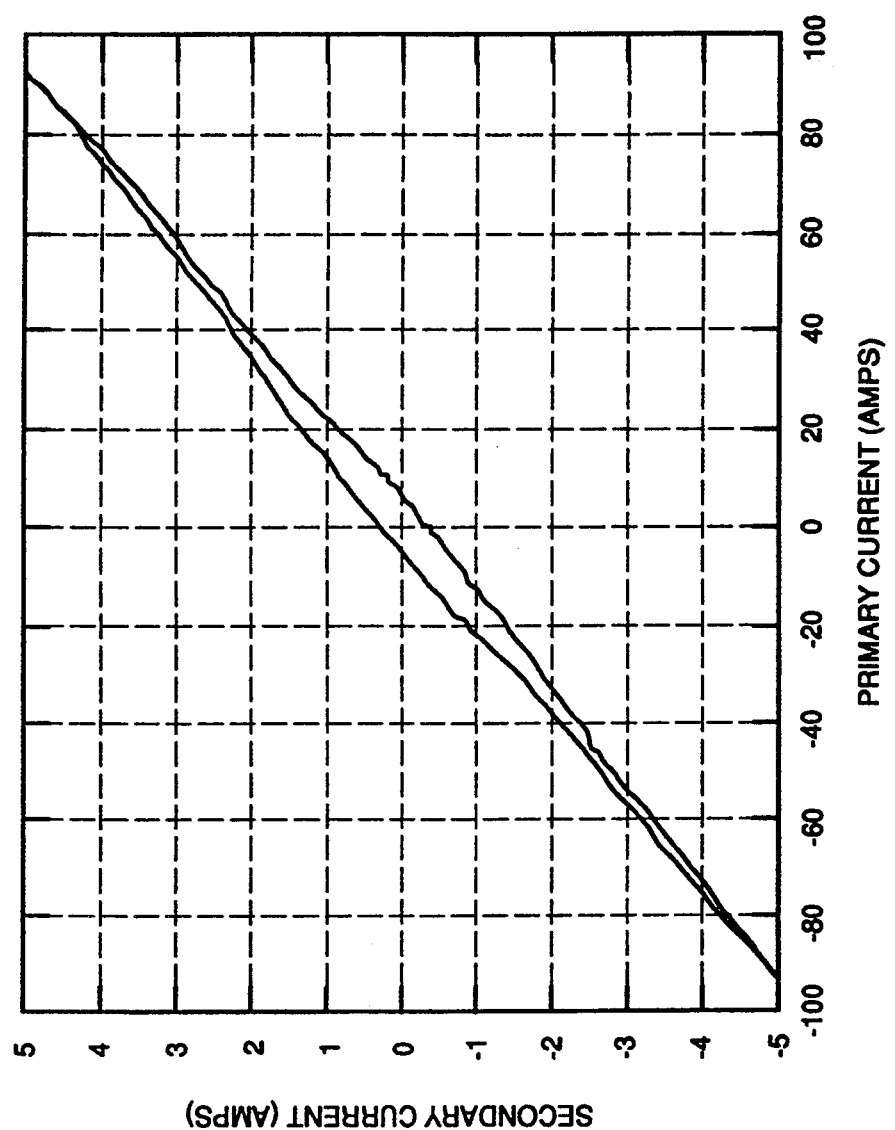
FIG. 9 illustrates a Lissajous function for a current transformer such as may be executed by the embodiment illustrated in FIG. 8.

The tremendous digital signal processing power of device or system 10 shown in FIG. 1 may now be realized by a number of different possible "programmed" configurations of the device. One such configuration, illustrated in FIG. 8, would be particularly useful in applications to provide a correction due to nonlinearities associated with conventional analog-to-digital conversion. Although, as described in aforementioned patent application Ser. No. 08/025,456 (RD-22,053), one bit quantization provides inherent linearity in the quantizer, nonlinearities may still occur as a result of common effects, such as component mismatch or finite operational amplifier gain. While these nonlinearities typically occur at a level below the resolution of the analog-to-digital converter, they may contribute additively to other nonlinearities in the processing path, including sensor nonlinearities, and thus may ultimately degrade overall system performance. Yet another significant source of nonlinearities from the system perspective may occur in the analog sensors themselves. For example, an iron core current transformer may introduce nonlinearities caused by the impedance of the core. Thus, nonlinearities may arise from the magnetic properties of the steel, discontinuities in flux due to the transformer design, leakage reactance of the windings, and effects resulting from significant temperature changes. FIG. 9 plots the Lissajous function for a one-hundred ampere toroidal iron core current transformer at room temperature illustrating these nonlinear effects. As will be appreciated by one skilled in the art, a toroidal core transformer is relatively linear in comparison with current transformers having other shaped cores, such as may typically be employed in power applications.

One method of correcting for the nonlinearities in the sensor/analog-to-digital converter pair is to calibrate the pair with known input signals and evaluate the output signals produced. By comparing the expected output signal, the error may be calculated and evaluated as a function of the input signal. Thus, calculating a "curve fit" of the input signals to the output signals results in a set of polynomial correction coefficients. For a third order correction of this type, the curve fit may be obtained from X and Y vectors respectively corresponding to the digitized or quantized versions of the input signals to the sensor and the digitized or quantized output signals from the analog-to-digital converter. Thus, a polynomial fit of the following form is performed.

$$p[x] = C_3 x^3 + C_2 x^2 + C_1 x + C_0 \quad [1]$$

The coefficients for the function p[x] corresponding to the vector Y may be determined by solving a system of simultaneous linear equations Ac=Y where the columns of A are successive powers of the X vector, A being the Vandermonde matrix. Once solved, these correction coefficients may be stored and used to correct for the combined sensor-converter nonlinearities. The device 100 configuration shown in FIG. 8 may implement such a third order polynomial correction in the following format:

$$p[x] = x(C_1 + x(C_2 + C_3 x)) \quad [2]$$

It will likewise be appreciated that $C_0$ of equation [1] is omitted. Any direct current offset would be removed through high pass filtering in any event due to the alternating nature of the signals that are measured and metered in power systems. Thus, implementing such a third order correction would required three successive "passes" of the data or electrical signals through multiply-accumulate processor 100. On the first pass y[n−4] is zero and $C_n$ is $C_3$.

Yet another potential correction scheme implementable by device 10 of FIG. 1 comprises a correction for the effect of temperature changes upon sensor output signals. One of the analog input ports 12 may be connected to a thermal coupler to act as a temperature sensor. For sensors that have "well-known" behavior as a function of temperature, the function may be evaluated and the correction may be performed during signal processing executed by the device. Alternatively, the temperature coefficient may be read from a look-up table stored in an "off device" memory and written to selected memory locations by external microprocessor 500.

Likewise, device 10 may be employed for digital signal processing in the following manner. A general or conventional infinite impulse response (IIR) filter may take the following form.

$$y[n] = - \sum_{k=1}^{N} a_k y[n-k] + \sum_{k=0}^{M} b_k \times [n-k] \quad [3]$$

As will be appreciated by one skilled in the art this is a form of a linear, constant coefficient, difference equation, providing a transfer function of the form expressed in the equation [4].

$$H(z) = \frac{\sum_{k=0}^{M} b_k z^{-k}}{1 + \sum_{k=1}^{N} a_k z^{-k}} \quad [4]$$

Figure 11A:
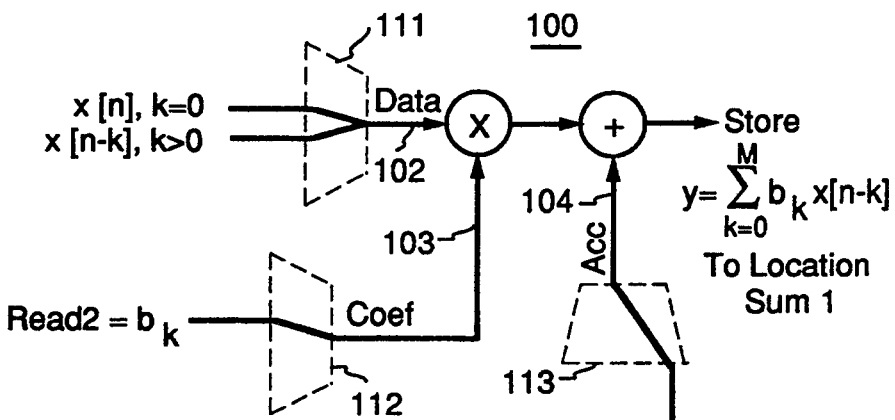
FIGS. 11A, 11B, and 11C respectively illustrate portions of another embodiment of a configuration of a programmable digital signal processor system in accordance with the invention.
Figure 11B:
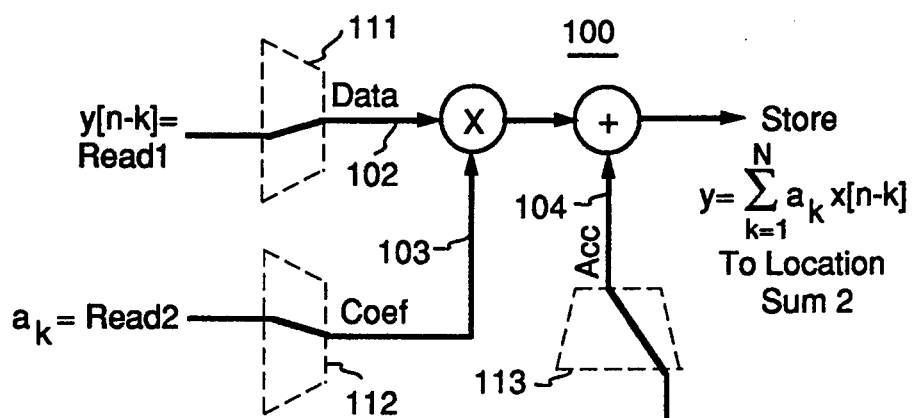
Figure 11C:
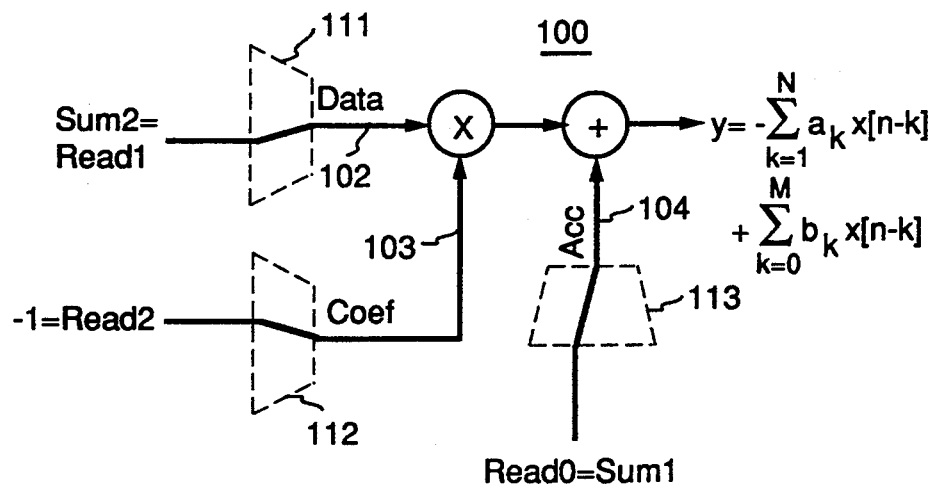

A conventional block diagram corresponding to this direct form realization of equation [3] is provided in FIG. 10. By configuring processor 100 as shown in FIGS. 11A, 11B, and 11C, IIR filters with "real" coefficients may be implemented. The input signals are assumed to be "real" because they are provided by analog-to-digital conversion. Thus, as illustrated in FIG. 11A terms relating to the "delayed" input signals and the $b_k$ values are multiplied and accumulated in a temporary storage location. Next, as illustrated in FIG. 11B, the terms requiring the multiplication of the previous output signals and the $a_k$ terms are multiplied and stored in a second temporary location. Third, and finally, as illustrated in FIG. 11C, the two partial sums are combined to yield the final output signal. The total number of instructions required to implement the IIR filter should typically be M+N+1. Likewise, the processing typically requires 2 (M+N+1) memory locations in memory unit 20. As will now be appreciated by one skilled in the art, the required number of instructions and memory locations doubles if the $b_k$ coefficients are complex, because the real and imaginary parts must be computed separately. Thus, the order of the filters realizable will depend on the resource limitations imposed by the amount of memory locations available.

A high pass IIR filter may likewise be implemented by a similar technique. As will be appreciated by one skilled in the art, the advantages of implementing a low order IIR high pass filter are many. First, it improves the resolution of the zero cross detection by removing the offsets, and second, it removes the requirement to store an offset coefficient to correct any analog-to-digital sensor offset error. One such filter is exemplified by equation [5] below.

$$y[n] = -a_1 y[n-1] + x[n] - x[n-1] \quad [5]$$

Figure 12:
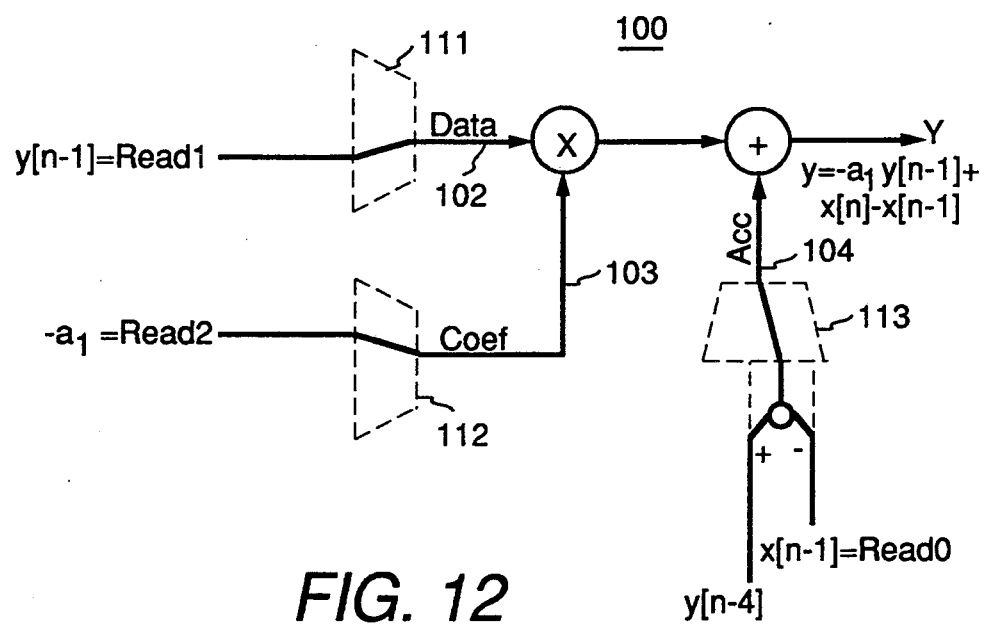
FIG. 12 illustrates yet another embodiment of a configuration of a programmable digital signal processor system in accordance with the invention.

As specified, this filter has $M=N=1$, where $b_0$ equals 1, $b_1$ equals $-1$, and $a_1$ is real. The advantage of such a filter in this particular embodiment of the invention is that it may be implemented using only two instructions in the format illustrated in FIG. 6. The first instruction places the input value into the instruction pipeline and thus involves storing an analog-to-digital sample value to a memory location, such as in memory unit 20. Then, the IIR high pass filter instruction may be located four instructions after the first instruction. This positions the high pass filter instruction so that $y[n-4]$ in the pipeline will contain $x[n]$ and the value stored in the memory location is still $x[n-1]$. This occurs because the value stored at the memory location has not yet been overwritten by instruction $n-4$ due to the 128 cycle latency. The MAC is then configured as shown in FIG. 12. Likewise, port 104 may select the $y[n-4]$ minus the memory location of $x[n-1]$ operation as an input signal thus performing the feed forward filtering operation without utilizing MAC resources. Likewise, port 102 is set so that it equals the memory location that contains $y[n-1]$ and port 103 is set so that it equals the memory location of $a_1$. The y output signal may then be the output signal of the IIR filter described by equation [5] and should be written to memory unit 20 (FIG. 1) at the location provided by the first instruction for the next iteration of the filter.

It will now be appreciated that if $N=0$, the direct form implementation of an IIR filter provides a finite impulse response (FIR) filter. Thus, an FIR filter may be implemented using only the configuration illustrated in FIG. 11A. This requires only one instruction per input or "tap" for a total of M instructions for FIR filters with real coefficients. Likewise, only two M locations of memory are required, M-1 for the x values and one for the sum. Again the number of instructions doubles when implementing filters with complex $b_k$ coefficients.

An important feature of device 10 of FIG. 1 is its ability to perform adaptive feedback control of the coefficients to update the fundamental or primary frequency coefficients in a Discrete Fourier Transform (DFT) algorithm. The DFT algorithm depends on the values of the coefficients in memory unit 50 or 60 and the initialization of the sine and cosine terms such as may be accomplished by a flag in the instruction format. As will be appreciated by one skilled in the art, any one of a number of techniques to accomplish this initialization may be employed.

The tremendous power of the device to accomplish digital signal processing may be realized from the use of a DFT algorithm to calculate frequency in which the number of samples in the cycle may be adaptively modified. This method has the advantage of not only permitting the calculation of frequency but also providing sequence component analysis, as well as harmonic content analysis in an adaptive scheme. The architecture previously described provides the ability under program control to calculate DFTs for each input phase, i.e., for each analog sensor. The architecture permits the microprocessor to load device 10 with the needed coefficients which allows highly accurate DFT calculations and reduces error in power calculations on a cycle by cycle basis by adaptively modifying the coefficients to match the output signals.

The DFT of the nth harmonic for an input channel m may now be calculated recursively by the structure previously described in conjunction with the following equations:

$$X_m(n) = \frac{2}{N} \sum_{k=0}^{N-1} x(k) e^{-j\frac{2\pi}{N}kn}$$
$$= X_c - jX_s,$$
where $$X_c(n) = \frac{2}{N} \sum_{k=0}^{N-1} x_k \cos\left(\frac{2\pi kn}{N}\right)$$

$$X_s(n) = \frac{2}{N} \sum_{k=0}^{N-1} x_k \sin\left(\frac{2\pi kn}{N}\right).$$

Thus, $$X_c(k+1) = \frac{2}{N}\left[X_c(k) + x_k \cos\left(\frac{2\pi n}{N}(k+1)\right)\right],$$

and $$X_s(k+1) = \frac{2}{N}\left[X_s(k) + x_k \sin\left(\frac{2\pi n}{N}(k+1)\right)\right].$$

Therefore, the DFT may be calculated recursively by letting $$\sigma = \frac{2\pi nk}{N},$$

$$\Delta\sigma = \frac{2\pi n}{N}.$$

Because $$(\sigma + \Delta\sigma) = \frac{2\pi n}{N}(k+1),$$

sine and cosine may be calculated using the identities
$\sin(\delta + \Delta\delta) = \sin\delta \cos\Delta\delta + \cos\delta \sin\Delta\delta$
$\cos(\delta + \Delta\delta) = \cos\delta \cos\Delta\delta - \sin\delta \sin\Delta\delta$
and initializing, termed "init trig",
$\sin\delta = \sin\pi/4$
$\cos\delta = \cos\pi/4 = \sin\pi/4$. Use of $\pi/4$ initially introduces a phase shift which may be subtracted in processing. Now, $\cos\Delta\delta$ and $\sin\Delta\delta$ may be stored as coefficients in memory units 50 and 60 based on the desired harmonic since $$\Delta\sigma = \frac{2\pi n}{N}.$$

Likewise, values of the coefficients may also be modified accordingly. Thus, a recursive relationship may be set up to calculate the real and imaginary parts of the nth harmonic for an input channel and thus yield a cycle by cycle DFT calculation for each channel.

Device or system 10 also permits the calculation of frequency on a cycle by cycle basis by a technique described in U.S. Pat. No. 4,597,726, "Means and Method for Measuring Power System Frequency," by Premerlani, issued Oct. 15, 1985, assigned to the assignee of the present invention and herein incorporated by reference. Related patents include U.S. Pat. No. 4,723,216, "Digital Frequency-Locked Loop for Use with Staggered Sampling Systems," by Premerlani, issued Feb. 2, 1988, and U.S. Pat. No. 4,715,000, "Digital Phase-Locked Loop and Frequency Measuring Device," by Premerlani, issued Dec. 22, 1987, both assigned to the assignee of the present invention and incorporated by reference. As described in U.S. Pat. No. 4,597,726, using each phase of a three phase balance system provides highly accurate frequencies in accordance with the following formula, $$\frac{\text{Imag } D}{\text{Real } D} = \tan\left[2\pi\left(\frac{f-f_o}{f_o}\right)\right], \quad [6]$$

where D is derived by summing a phaser associated with each phase of a three phase system, $f_o$ is the frequency which is used to obtain an integer number of samples per cycle and f is the actual signal frequency. The knowledge of the frequency with respect to $f_o$ may be used to adaptively modify the number of samples per cycle, as previously described.

While only certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A system for processing at least one externally derived electrical power signal, said signal being substantially continuous, substantially alternating, and having a primary frequency, said system comprising:
   a multiply-accumulate processor having three input ports, an output port, and a processor control signal port, said multiply-accumulate processor performing, in response to predetermined processor control signals, predetermined arithmetic operations on digital input signals substantially derived from said at least one substantially continuous electrical signal and arriving at a substantially predetermined rate;
   a first memory unit for storing a plurality of processor control signals;
   a second and third memory unit, each for storing a separate plurality of processor digital input signals; and
   a memory control unit which, in response to externally derived memory unit control signals, respectively couples said first memory unit to said processor control signal port, and the first processor input port to one of said second and third memory units for each successive cycle of the primary frequency so that the digital input signals derived from the substantially continuous electrical signal and provided to one of the three processor input ports are continually processed by said processor for a predetermined number of successive cycles of the primary frequency.

2. The system of claim 1, wherein the primary frequency is substantially 60 cycles per second.

3. The system of claim 1, wherein said memory control unit further couples said first processor input port from said second memory unit to said third memory unit substantially between two successive cycles of the primary frequency.

4. The system of claim 1, wherein said memory control unit further couples said first processor input port from said third memory unit to said second memory unit substantially between two successive cycles of the primary frequency.

5. The system of claim 1, and further comprising a fourth memory unit for storing a plurality of processor output signals; and
   wherein said processor includes a processor control signal decoder having a processor interface port coupled to said memory control unit for providing processor derived memory unit control signals;
   said processor output port being coupled to said fourth memory unit, and said memory control unit storing processor output signals in said fourth memory unit in response to the processor derived memory unit control signals.

6. The system of claim 5, and further comprising:
   at least one analog-to-digital converter providing quantized digital electrical signals on an output port thereof, substantially at the predetermined rate, said converter being responsive to the electrical signal substantially having a primary frequency;
   said memory control unit coupling said converter output port to the second processor input port in response to the externally derived memory control unit signals.

7. The system of claim 6, wherein said converter comprises a sigma-delta modulator and a decimation filter coupled to the output of said sigma-delta modulator.

8. The system of claim 7, wherein said converter further comprises a parallel to serial binary interface coupled to the output port of said decimation filter.

9. The system of claim 8, wherein said parallel to serial binary interface comprises a shift register, and a latch coupled to the output port of the shift register.

10. The system of claim 6, and further comprising a plurality of other analog-to-digital converters, each of said converters comprising a sigma-delta modulator and a decimation filter coupled to the output port of the modulator, a cyclical register provides binary electrical signals on an output port at the predetermined rate, each of said decimation filters being coupled to an input port of said cyclical register, each of said modulators being responsive to an externally derived, substantially continuous substantially alternating, electrical signal substantially having the primary frequency of said one externally derived electrical power signal.

11. The system of claim 5, wherein said processor output port is also coupled to said first memory unit,
    said memory control unit also storing processor output signals in said first memory unit in response to predetermined processor derived memory unit control signals.

12. The system of claim 11, and further comprising an external microprocessor, and a microprocessor interface coupling said memory control unit to said external microprocessor, said microprocessor interface for providing microprocessor derived memory unit control signals from said microprocessor to said memory control unit, the microprocessor derived memory unit control signals constituting the externally derived memory unit control signals, said microprocessor interface further for transferring electrical signals between said microprocessor and said memory control unit.

13. The system of claim 12, wherein said memory control unit has the capability to transfer stored electrical signals between said one of said memory units and said microprocessor interface in response to microprocessor derived memory unit control signals.

14. The system of claim 13, wherein said one of said memory units comprises said fourth memory unit.

15. The system of claim 14, wherein said memory control unit provides control to said first and fourth memory units so that processor output signals are stored in one of said first memory unit and said fourth memory unit for predetermined portions of a cycle of said primary frequency in response to processor derived memory unit control signals.

16. The system of claim 15, wherein at least one of said decimation filters comprises a programmable length decimation filter.

17. The system of claim 12, wherein said memory control unit, in response to microprocessor derived memory unit control signals, couples one of said second and third memory units to said microprocessor interface for each cycle of said primary frequency so as to transfer stored electrical signals between the memory unit thus coupled and said microprocessor, said microprocessor generating during at least one cycle of said primary frequency a set of electrical signals for storage in one of said second and third memory units such that one of the signals of said set will control the number of converter output signals received by said processor in a later primary frequency cycle.

18. The system of claim 17, wherein said memory control unit further couples said interface from said second memory unit to said third memory unit in an interval substantially between two successive cycles of the primary frequency.

19. The system of claim 17, wherein said memory control unit further couples said interface from said third memory unit to said second memory unit in an interval substantially between two successive cycles of the primary frequency.

20. The system of claim 17, wherein said memory control unit has the capability to exchange said second and third memory units between said microprocessor interface and said second processor input port at the beginning of each cycle of the primary frequency so that the said interface and said second input port are respectively coupled to different memory units.

21. The system of claim 17, wherein said first memory unit incorporates processor control signals capable of executing a discrete fourier transform.

22. The system of claim 21, wherein said discrete fourier transform constitutes a recursive discrete fourier transform.

23. The system of claim 22, wherein said microprocessor incorporates a program for sampling predetermined selected frequencies for each of the externally derived alternating electrical signals on each cycle of the primary frequency.

24. The system of claim 23, wherein said microprocessor program has the capability to modify the selected frequencies sampled in response to the processor output signals transferred to said microprocessor from said fourth memory device.

25. The system of claim of claim 17, wherein said microprocessor incorporates a program having the capability to generate a set of processor input signals on each cycle of said primary frequency in response to the processor output signals generated on a previous cycle.

26. The system of claim 12, wherein each of said memory units comprises a respective random access memory.

27. The system of claim 11, wherein said memory control unit has the capability to switch said processor output signals between said first memory unit and said fourth memory unit and said second input port between said register output port and said first memory unit during each cycle of the primary frequency, whereby said system has the capability to further process said processor output signals

* * * * *